(12) United States Patent
Kiyosawa

(10) Patent No.: US 9,752,806 B2
(45) Date of Patent: Sep. 5, 2017

(54) TEMPERATURE ADJUSTMENT APPARATUS

(75) Inventor: Wataru Kiyosawa, Hiratsuka (JP)

(73) Assignee: KELK Ltd., Kanagawa (JP)

(*) Notice: Subject to any disclaimer, the term of this patent is extended or adjusted under 35 U.S.C. 154(b) by 1241 days.

(21) Appl. No.: 13/109,069

(22) Filed: May 17, 2011

(65) Prior Publication Data

US 2011/0283715 A1  Nov. 24, 2011

(30) Foreign Application Priority Data

May 18, 2010 (JP) ................. 2010-114303

(51) Int. Cl.
| | |
|---|---|
| F25B 21/04 | (2006.01) |
| H01L 35/00 | (2006.01) |
| H01L 35/34 | (2006.01) |
| H01L 35/30 | (2006.01) |
| F25B 21/02 | (2006.01) |
| H01L 35/32 | (2006.01) |

(52) U.S. Cl.
CPC .............. *F25B 21/02* (2013.01); *H01L 35/32* (2013.01)

(58) Field of Classification Search
CPC .......... F25B 21/02; F25B 21/04; H01L 35/32; H01L 21/6833; H01L 35/34; H01L 35/30; H01L 35/00; C23C 16/4586
USPC ............. 62/3.7, 3.3, 3.2; 136/201, 203, 204; 700/121, 205, 207, 299
See application file for complete search history.

(56) References Cited

U.S. PATENT DOCUMENTS

| | | | | |
|---|---|---|---|---|
| 5,059,770 A | * | 10/1991 | Mahawili | .......... H01L 21/67103 219/390 |
| 5,740,016 A | * | 4/1998 | Dhindsa | .............. C23C 16/4586 165/11.1 |
| 5,802,856 A | * | 9/1998 | Schaper | .................... B01L 7/52 118/724 |
| 6,112,525 A | * | 9/2000 | Yoshida | ................. F25B 21/02 62/3.2 |
| 6,347,521 B1 | * | 2/2002 | Kadotani | ............... F25B 21/02 136/204 |
| 6,900,986 B2 | * | 5/2005 | Kimoto | ................. H02M 7/003 257/678 |

(Continued)

FOREIGN PATENT DOCUMENTS

| | | |
|---|---|---|
| JP | A-2000-508119 | 6/2000 |
| JP | 2001111121 A * | 4/2001 |

(Continued)

*Primary Examiner* — Frantz Jules
*Assistant Examiner* — Martha Tadesse
(74) *Attorney, Agent, or Firm* — Posz Law Group, PLC

(57) ABSTRACT

A temperature adjustment apparatus suppresses decline in temperature adjustment performance by avoiding even partial impairment of the function of a thermoelectric module in respective zones, which is accomplished due to the presence of terminals. A terminal is provided via an electrode extension section on a heat exchange plate side electrode of the thermoelectric module of inner zones apart from an outermost zone, of four zones. The electrode extension section is disposed at a position which is sandwiched between adjacent thermoelectric elements and over which a temperature adjustment side electrode spans. The terminals are disposed outside the thermoelectric module in the outermost zone.

19 Claims, 19 Drawing Sheets

STRUCTURE OF THERMOELECTRIC MODULE

41 TEMPERATURE ADJUSTMENT SIDE ELECTRODE
42 HEAT EXCHANGE PLATE SIDE ELECTRODE
43P, 43N THERMOELECTRIC ELEMENT
44 ELECTRODE EXTENSION SECTION
45 TERMINAL
50 ELECTRODE TERMINAL

(56) References Cited

U.S. PATENT DOCUMENTS

| | | | | |
|---|---|---|---|---|
| 7,417,206 B2* | 8/2008 | Nakamura | ........ | H01L 21/67103 219/444.1 |
| 7,978,963 B2* | 7/2011 | Shimizu | ................ | H01L 21/324 118/724 |
| 2009/0189239 A1* | 7/2009 | Tokunaga | ................ | H01L 35/08 257/467 |
| 2011/0066294 A1* | 3/2011 | Takechi | ............ | H01L 21/67005 700/282 |

FOREIGN PATENT DOCUMENTS

| | | |
|---|---|---|
| JP | A-2001-111121 | 4/2001 |
| WO | WO 97/37375 | 10/1997 |

* cited by examiner

IN-PLANE TEMPERATURE DISTRIBUTION

FIRST EMBODIMENT

CROSS-SECTIONAL DIAGRAM OF THERMOELECTRIC MODULE

41 TEMPERATURE ADJUSTMENT SIDE ELECTRODE
42 HEAT EXCHANGE PLATE SIDE ELECTRODE
43 (43P, 43N) THERMOELECTRIC ELEMENT
44 ELECTRODE EXTENSION SECTION
45 { 45A POSITIVE TERMINAL
     45B NEGATIVE TERMINAL
50 ELECTRODE TERMINAL

IN-PLANE TEMPERATURE DISTRIBUTION OF SECOND EMBODIMENT

IN-PLANE TEMPERATURE DISTRIBUTION

SECOND EMBODIMENT

COMPARATIVE EXAMPLE

TEMPERATURE ADJUSTMENT APPARATUS

BACKGROUND OF THE INVENTION

1. Field of the Invention

The present invention relates to a temperature adjustment apparatus for a temperature adjustment object, such as a semiconductor wafer.

2. Description of the Related Art

Steps for processing a semiconductor wafer, such as a silicon wafer, include steps where the temperature of the silicon wafer must be controlled to a target temperature and the temperature distribution in the plane of the silicon wafer (or the deposited material on the silicon wafer) must be controlled to a desired temperature distribution. In particular, in recent years there has been a requirement for the temperature distribution in the plane of the silicon wafer to be set accurately to a desired temperature distribution (either to make the temperature distribution uniform in the plane or to vary the temperature distribution in different parts of the plane), with a view to improving the quality of semiconductor devices.

Therefore, in order to improve the accuracy of temperature adjustment described above, technology for dividing a thermoelectric module into a plurality of zones and controlling the temperature independently in each zone has been implemented.

FIG. 1 shows a structure of a conventional temperature adjustment apparatus 100.

As shown in FIG. 1, the temperature adjustment apparatus 100 comprises a stage 20 on which a silicon wafer forming a temperature adjustment object (semiconductor wafer) is placed, a heat exchange plate 30 constituted by a cooling plate, for instance, and a thermoelectric module plate 140 which is sandwiched between the stage 20 and the heat exchange plate 30. The thermoelectric module plate 140 is a plate on which the thermoelectric module 40 is disposed, and the portion which functions as the thermoelectric module 40 in the thermoelectric module plate 140 is indicated by diagonal hatching.

As shown in FIG. 2A, in the thermoelectric module 40, temperature adjustment side electrodes 41 are disposed on the stage 20 side, heat exchange plate side electrodes 42 are disposed on the heat exchange plate 30 side, the temperature adjustment electrodes 41 are connected to one end surface of thermoelectric elements 43P, 43N, and the heat exchange plate side electrodes 42 are connected to the other end surface of the thermoelectric elements 43P, 43N. The thermoelectric module 40 is constituted by electrically connecting P-type thermoelectric elements (thermoelectric semiconductors) 43P and N-type thermoelectric elements (thermoelectric semiconductors) 43N in alternating fashion, by means of the electrodes 41 and 42.

The thermoelectric module 40 is operated by passing an electric current through the heat exchange plate side electrodes 42 via terminals 45. In other words, when the electric current is passed through the P-type and N-type thermoelectric elements 43P and 43N which are connected in series to the temperature adjustment electrodes 41 and the heat exchange plate side electrodes 42, a movement of electric charge occurs between the electrodes and a movement of heat occurs due to the heat (energy) carried by that charge. By this means, the temperature adjustment electrode 41 side, on the one hand, is cooled due to a heat absorbing effect, and the heat exchange plate side electrode 42 side, on the other hand, radiates heat due to a heat generating effect. Furthermore, if the electric current is passed in the opposite direction, then heat is radiated due to a heat generating effect on the temperature adjustment electrode 41 side. In other words, a heat absorbing effect or a heat generating effect is produced in the plane of the stage 20 which corresponds to the temperature adjustment electrode 41 side, depending on the direction in which the electric current is passed. The operation of the thermoelectric module 40 described above is complemented by use of a chiller, to perform temperature adjustment of a silicon wafer on the plane of the stage 20.

FIG. 3 is a plan diagram of a conventional thermoelectric module 40.

The thermoelectric module 40 is arranged so as to be able to control the temperature independently by passing the electric current through the terminals 45 in each of a plurality of zones 11, 12, 13, 14 from the center toward the outside of the stage 20. The central zone 11 is formed in a circular shape, and the respective zones 12, 13, 14 outside this central zone 11 are formed in a ring shape. The terminals 45 of the plurality of zones 11, 12, 13, 14 are disposed inside the zones 11, 12, 13, 14.

As shown in FIG. 1, holes 45a, 30a are formed respectively in the terminals 45 and the heat exchange plate 30, and shafts 51 for passing the electric current are inserted through the holes 45a of the terminals 45 and the heat exchange plate 30. An electric signal line (not illustrated) is electrically connected from the exterior to the shafts 51, and the electric current is passed through the heat exchange plate side electrodes 42.

The patent reference, Japanese Patent Application Publication No. 2000-508119 discloses a composition in which a thermoelectric module is arranged so as to be able to control the temperature independently by passing the electric current via terminals in each of a plurality of zones from the center of the stage toward the outer sides. This reference also describes an invention in which thermoelectric modules are operated independently for each zone, the temperature distribution in the plane of a silicon wafer placed on the stage is made uniform, and the temperature in the plane is controlled in such a manner that the temperature distribution is different in an inner circumferential portion and an outer circumferential portion.

The patent reference, Japanese Patent Application Publication No. 2001-111121 discloses a composition in which an expansion section is provided so as to extend to a position near a bolt installation hole, in a temperature adjustment side electrode on a stage. This bolt installation hole is a hole through which a bolt in inserted to join the stage and the heat exchange plate (water-cooled plate) together.

SUMMARY OF THE INVENTION

In the arrangement of the thermoelectric module 40 according to the prior art shown in FIG. 3, the terminals 45 of the plurality of zones 11, 12, 13, 14 are disposed inside respective zones 11, 12, 13, 14, and therefore the thermoelectric elements 43P, 43N and the temperature adjustment electrodes 41 cannot be disposed in the portion where the terminals 45 are located, and the function of the thermoelectric module 40 is impaired in this portion. More specifically, an area of thermal loss occurs in a portion of each zone, and regardless of the fact that heat exchange is essentially required in that portion, heat exchange is not performed in the portion and the required temperature adjustment performance is impaired.

In particular, the greater the number of zones, the greater the number of terminals 45 for supplying power to the thermoelectric module 40 in each zone, and therefore the surface area which does not function as a thermoelectric module 40 increases and the temperature adjustment performance declines.

In order to improve the accuracy of the temperature adjustment performance, ideally, the thermoelectric elements 43P, 43N, the temperature adjustment electrodes 41 and the heat exchange plate side electrodes 42 are arranged in regular fashion without interruptions in accordance with the shape of the zones 11, 12, 13, 14 (circular shape or ring shape). However, due to the presence of the terminals 45, it is difficult to achieve a regular arrangement without any interruptions. This is described here with reference to FIG. 4 and FIG. 5.

FIG. 4 and FIG. 5 are enlarged views of a portion of a plan diagram of a conventional thermoelectric module 40 and show an example of an arrangement of terminals 45 which are connected electrically to the thermoelectric elements 43P, 43N, and heat exchange plate side electrodes 42.

In FIG. 4, terminals 45 which pass the electric current to the zone 13 are arranged in a portion of the zone 13 where the thermoelectric elements 43P, 43N and the heat exchange plate side electrodes 42 should ideally be arranged in a ring shape. Therefore, the function of the thermoelectric module 40 is impaired in an intermediate portion of the ring shape of the zone 13, and it is difficult to create a uniform temperature distribution in the whole area of the zone 13.

FIG. 5 shows an example where terminals 45 which pass the electric current to the zone 12 are arranged so as to extend to the inner zone 11. Therefore, an omitted portion which does not function as a thermoelectric module 40 occurs in a portion of the zone 11 where the thermoelectric elements 43P, 43N and the heat exchange plate side electrodes 42 should ideally be arranged in a perfect circular shape, and hence the thermoelectric module 40 only functions in a distorted shape, giving rise to localized falls in the temperature adjustment function and making it difficult to create a uniform temperature distribution in the whole area of the zone 11.

The present invention was devised in view of these circumstances, an object thereof being to enable suppression of decline in temperature adjustment performance as a result of impairment of the function of a thermoelectric module 40 in respective zones 1, 2, 3, 4 . . . due to the presence of terminals 45.

The composition for achieving the object of the present invention is not disclosed in any of the above-mentioned references.

Therefore, a first invention is a temperature adjustment apparatus which has a stage on which a temperature adjustment object is placed, a heat exchange plate, and a thermoelectric module in which a temperature adjustment side electrode is disposed on a stage side, a heat exchange plate side electrode is disposed on a heat exchange plate side, the temperature adjustment side electrode is connected to one end face of a thermoelectric element and a heat exchange plate side electrode is connected to the other end face of the thermoelectric element, the temperature adjustment apparatus being configured to perform temperature adjustment of the temperature adjustment object by operating the thermoelectric module through passing an electric current to the heat exchange plate side electrode via a terminal, wherein the thermoelectric module is disposed such that temperature adjustment can be performed independently, in each of a plurality of zones, from a center toward an outer side of the stage by passing the electric current via terminals; a terminal is provided via an electrode extension section to the heat exchange plate side electrode of at least one zone of a plurality of zones; the electrode extension section is disposed at a position which is sandwiched between adjacent thermoelectric elements and over which a temperature adjustment side electrode spans; and terminals are disposed outside an outermost zone and/or in a zone having the largest surface area.

The second invention is the temperature adjustment apparatus of the first invention, wherein a terminal is provided, via an electrode extension section, to the heat exchange plate side electrode of the thermoelectric module of each zone apart from an outermost zone, of the plurality of zones; and the terminals of all of the zones are disposed outside the outermost zone.

The third invention is the temperature adjustment apparatus of the first invention, wherein the terminals of all of the zones are disposed in an innermost zone.

The fourth invention is the temperature adjustment apparatus of the first invention, wherein the terminals of all of the zones are disposed in a zone having the largest surface area.

The fifth invention is the temperature adjustment apparatus of the first invention, wherein the terminals of an outer zone of a plurality of zones are disposed outside the outermost zone, and the terminals of an inner zone are disposed in an innermost zone.

The sixth invention is the temperature adjustment apparatus of the first invention, wherein the terminals of each zone are constituted by a positive terminal and a negative terminal; electrode extension sections are provided respectively to the positive terminal and the negative terminal; and one of the positive terminal and the negative terminal of at least one zone is disposed in an inner zone via an electrode extension section, and the other one of the positive terminal and the negative terminal is disposed in an outer zone via an electrode extension section.

The seventh invention is the temperature adjustment apparatus of the third invention, wherein the terminals of each zone are constituted by a positive terminal and a negative terminal; electrode extension sections are provided respectively to the positive terminal and the negative terminal; and the positive terminal provided with an electrode extension section and the negative terminal provided with an electrode extension section are disposed at positions mutually separated by a distance corresponding to at least two thermoelectric elements.

The eighth invention is the temperature adjustment apparatus of the fourth invention, wherein the terminals of each zone are constituted by a positive terminal and a negative terminal; electrode extension sections are provided respectively to the positive terminal and the negative terminal; and the positive terminal provided with an electrode extension section and the negative terminal provided with an electrode extension section are disposed at positions mutually separated by a distance corresponding to at least two thermoelectric elements.

The ninth invention is the temperature adjustment apparatus of the fourth invention, wherein the terminals of each zone are constituted by a positive terminal and a negative terminal; electrode extension sections are provided respectively to the positive terminal and the negative terminal; and the positive terminal provided with an electrode extension section and the negative terminal provided with an electrode extension section are disposed at positions separated by a distance corresponding to at least two thermoelectric elements from a boundary of a zone having the largest surface area.

The tenth to fourteenth inventions are respectively the first to fifth inventions, wherein holes are formed in the terminals and the heat exchange plate, and shafts for passing the electric current are inserted through the holes in the terminals and the heat exchange plate.

The fifteenth to nineteenth inventions are respectively the first to fifth inventions, wherein the heat exchange plate side electrode, the electrode extension section and the terminal are formed in an integrated fashion.

According to the present invention, terminals are provided via electrode extension sections to the heat exchange plate side electrodes of at least one zone of a plurality of zones, the electrode extension sections being respectively disposed in positions sandwiched between mutually adjacent thermoelectric elements and over which a temperature adjustment side electrode spans, and the terminals being disposed outside the outermost zone and/or in the zone having the largest surface area. Consequently, the present actions and beneficial effects are obtained.

In the portion of each zone where electrode extension sections are located, the temperature adjustment side electrodes are arranged so as to span over the electrode extension sections. Therefore, in the portions of the zones where the electrode extension sections are located, the function of the thermoelectric module is maintained, without any interruption of the function of the thermoelectric module.

The outer side of the outermost zone is a portion which does not in principle function as a thermoelectric module, and although the terminals are disposed in this place, this does not affect the functions of the thermoelectric module. Furthermore, the zone having the largest surface area suffers relatively little effect on the temperature distribution in that zone if a terminal of the same size is disposed therein, compared to a zone of smaller surface area.

Therefore, according to the present invention, it is possible to suppress decline in the temperature adjustment function due to the presence of the terminals, and the effects on the temperature distribution of the zones can be minimized.

BRIEF DESCRIPTION OF THE DRAWINGS

FIG. 11A relates to an embodiment of the invention and FIG. 11B is in-plane temperature distribution chart for comparison with the prior art;

DETAILED DESCRIPTION OF THE INVENTION

Below, embodiments of a temperature adjustment apparatus relating to the present invention will be described with reference to the drawings.

Figure 6:
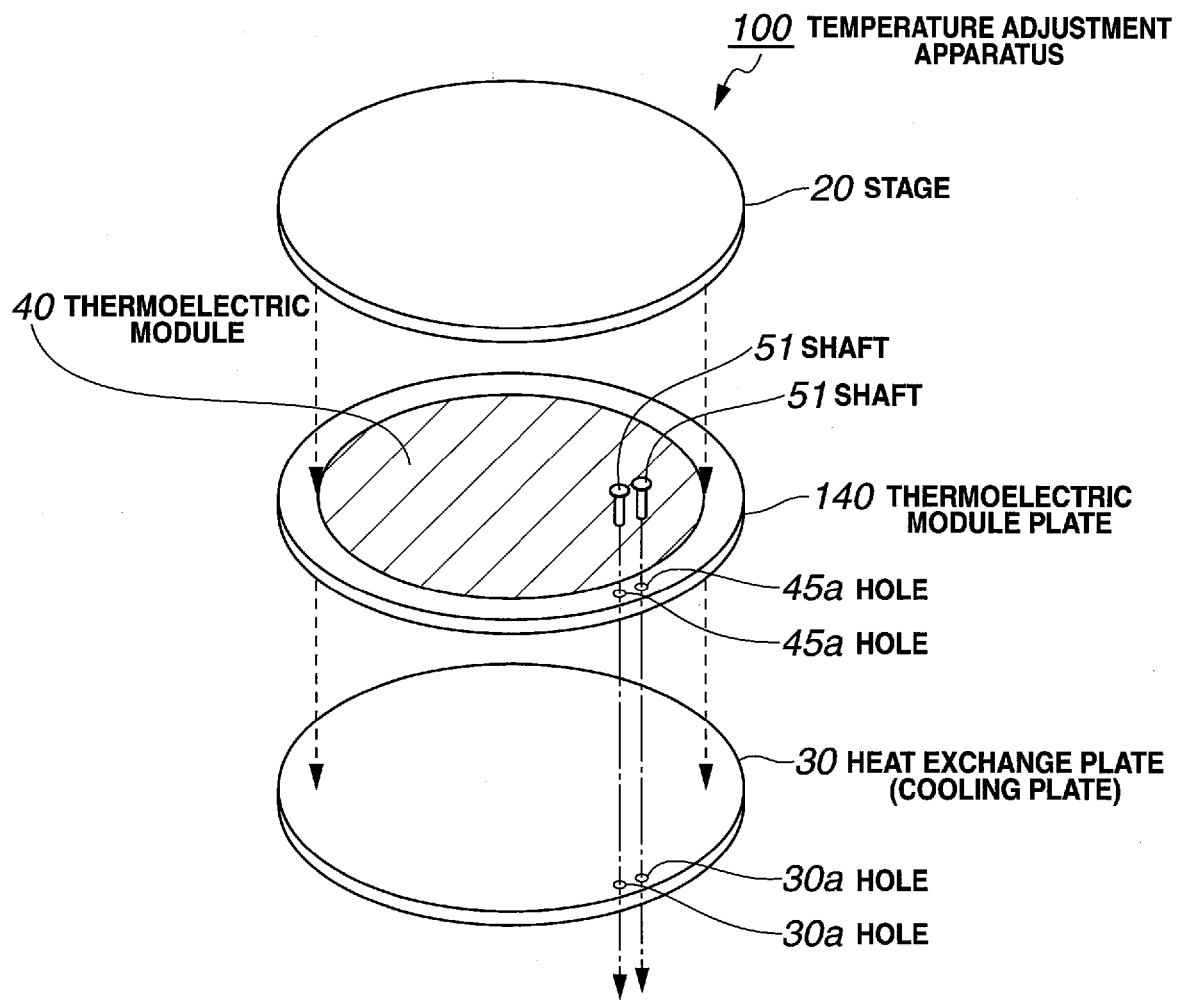
FIG. 6 is a diagram showing a composition of a temperature adjustment apparatus according to an embodiment.

FIG. 6 shows the composition of the temperature adjustment apparatus 100.

The temperature adjustment apparatus 100 according to the present embodiment is an apparatus which controls the temperature of a silicon wafer (not illustrated) disposed on a stage 20, to a desired temperature, as well as controlling the temperature distribution in the plane of the silicon wafer to a desired temperature distribution. This temperature adjustment apparatus 100 is used in a dry process, for example. A chiller apparatus used in the temperature adjustment apparatus 100 is omitted from the drawings.

As shown in FIG. 6, the temperature adjustment apparatus 100 comprises a stage 20 on which a silicon wafer forming a temperature adjustment object (semiconductor wafer) is placed, a heat exchange plate 30 constituted by a cooling plate, for instance, and a thermoelectric module plate 140 which is sandwiched between the stage 20 and the heat exchange plate 30. The thermoelectric module plate 140 is a plate on which the thermoelectric module 40 is disposed, and the portion which functions as the thermoelectric module 40 in the plane of the thermoelectric module plate 140 is indicated by diagonal hatching.

The stage 20 is disposed inside a vacuum chamber, for example. A semiconductor wafer, for example, a silicon wafer, is placed on the stage 20. The silicon wafer is held on the stage 20 by static electricity. However, it is also possible to pass helium gas between the stage 20 and the silicon wafer in order to raise the heat transmission efficiency between the stage 20 and the silicon wafer. During a dry process, the interior of the vacuum chamber is evacuated and held at a prescribed low pressure.

A thermoelectric module 40 is disposed below the stage 20 so as to be able to adjust the temperature distribution in the plane of the silicon wafer placed on the stage 20.

Figure 1:
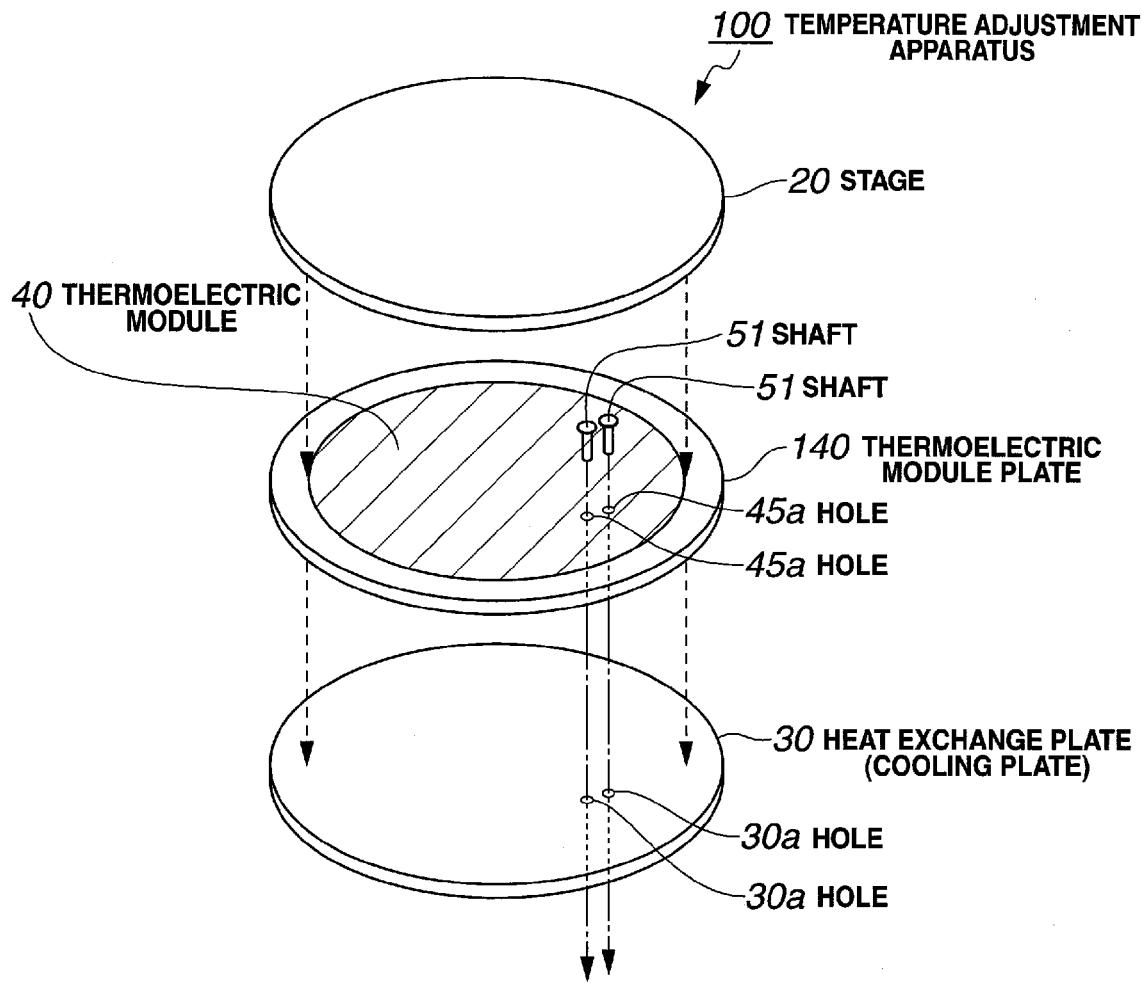
FIG. 1 is a diagram showing a structure of a conventional temperature adjustment apparatus.
Figure 2A:
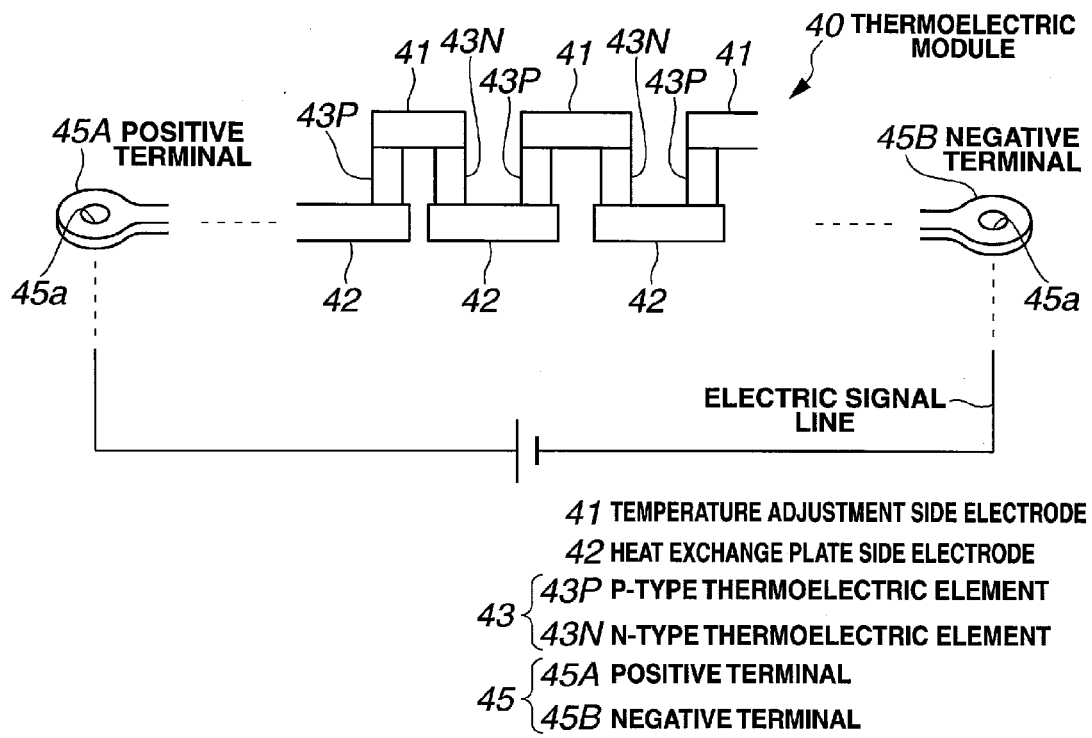
FIG. 2A is a diagram for describing the operation of a thermoelectric module.

As shown in FIG. 2A, in the thermoelectric module 40, a temperature adjustment side electrode 41 is disposed on the stage 20 side, a heat exchange plate side electrode 42 is disposed on the heat exchange plate 30 side, the temperature adjustment electrode 41 is connected to one end surface of the thermoelectric elements 43P, 43N, and the heat exchange plate side electrode 42 is connected to the other end surface of the thermoelectric elements 43P, 43N. The thermoelectric module 40 is constituted by electrically connecting P-type thermoelectric elements (thermoelectric semiconductors) 43P and N-type thermoelectric elements (thermoelectric semiconductors) 43N in alternating fashion, by means of the electrodes 41 and 42. In the following description, when the thermoelectric elements are described generally without distinguishing between P type and N type, then they are referred to generally as "thermoelectric elements 43".

The thermoelectric module 40 is operated by passing the electric current through the heat exchange plate side electrodes 42 via terminals 45. Here, the terminals 45 comprise positive terminals 45A and negative terminals 45B. In the present specification, when the terminals are treated as the same without distinguishing between the positive terminal 45A and the negative terminal 45B, they are referred to as "terminals 45", and when the positive terminal 45A and the negative terminal 45B are to be distinguished, then they specified as "positive terminal 45A" and the "negative terminal 45B".

When the electric current is passed through the P-type and N-type thermoelectric elements 43P and 43N which are connected in series to the temperature adjustment electrodes 41 and the heat exchange plate side electrodes 42, a movement of electric charge occurs between the electrodes and a movement of heat occurs due to the heat (energy) carried by that charge. By this means, the temperature adjustment electrode 41 side, on the one hand, is cooled due to a heat absorbing effect, and the heat exchange plate side electrode 42 side, on the other hand, radiates heat due to a heat generating effect. Furthermore, if the electric current is passed in the opposite direction, then heat is radiated due to a heat generating effect on the temperature adjustment electrode 41 side. In other words, a heat absorbing effect or a heat generating effect is produced in the plane of the stage 20 which corresponds to the temperature adjustment electrode 41 side, depending on the direction in which the electric current is passed. The operation of the thermoelectric module 40 described above is complemented by use of a chiller, to perform temperature adjustment of a silicon wafer on the plane of the stage 20.

First Embodiment

In the first embodiment, the terminals 45 of all zones 11, 12, 13, 14 are disposed outside the outermost zone 14. Unless stated expressly otherwise, in the first embodiment also, the thermoelectric module 40 is constituted by four zones 11, 12, 13, 14, and the zone 11 on the innermost side of these four zones 11, 12, 13, 14 has the largest surface area.

Figure 7:
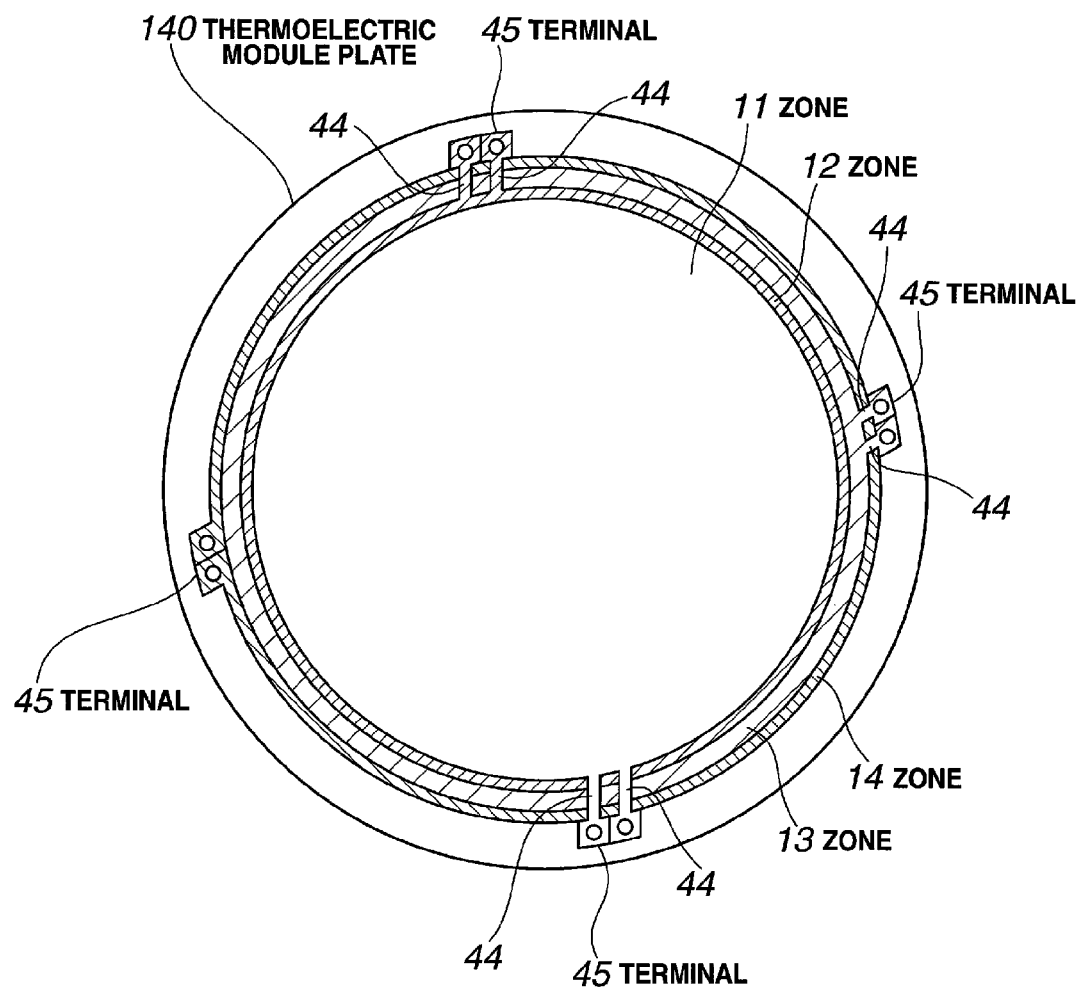
FIG. 7 is a plan diagram of a thermoelectric module plate according to a first embodiment.

FIG. 7 is a plan diagram of a thermoelectric module plate 140 according to the first embodiment.

The thermoelectric module 40 is arranged so as to be able to control the temperature independently by passing the electric current through the terminals 45 in each of a plurality of zones 11, 12, 13, 14 from the center toward the outside of the stage 20. The central zone 11 is formed in a circular shape, and the respective zones 12, 13, 14 outside this central zone 11 are formed in a ring shape.

Figure 8:
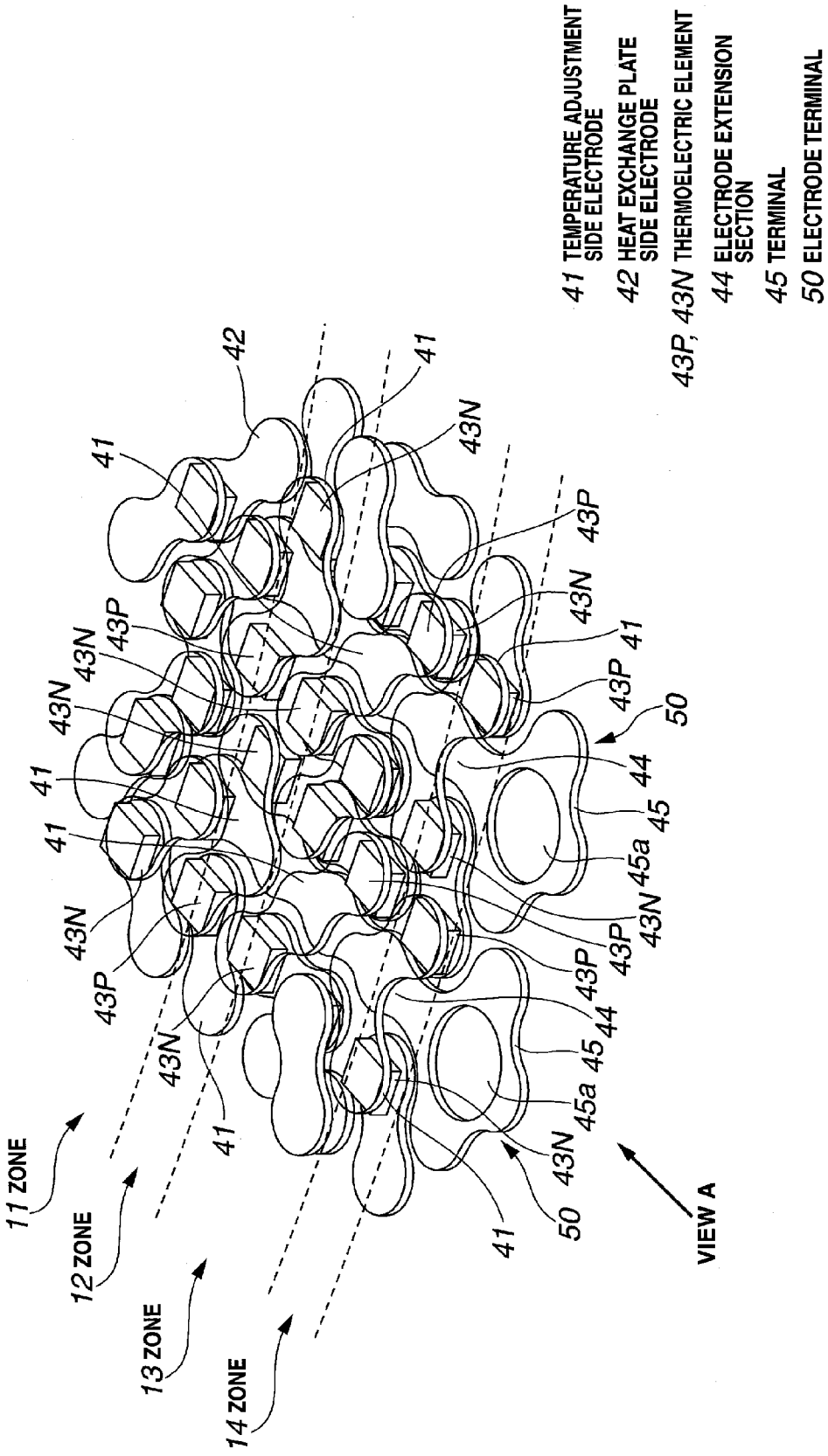
FIG. 8 is a schematic drawing of the structure of a thermoelectric module.

FIG. 8 shows a perspective view of the structure of the thermoelectric module 40. Furthermore, FIG. 9 shows a view along arrow A in FIG. 8.

Figure 9:
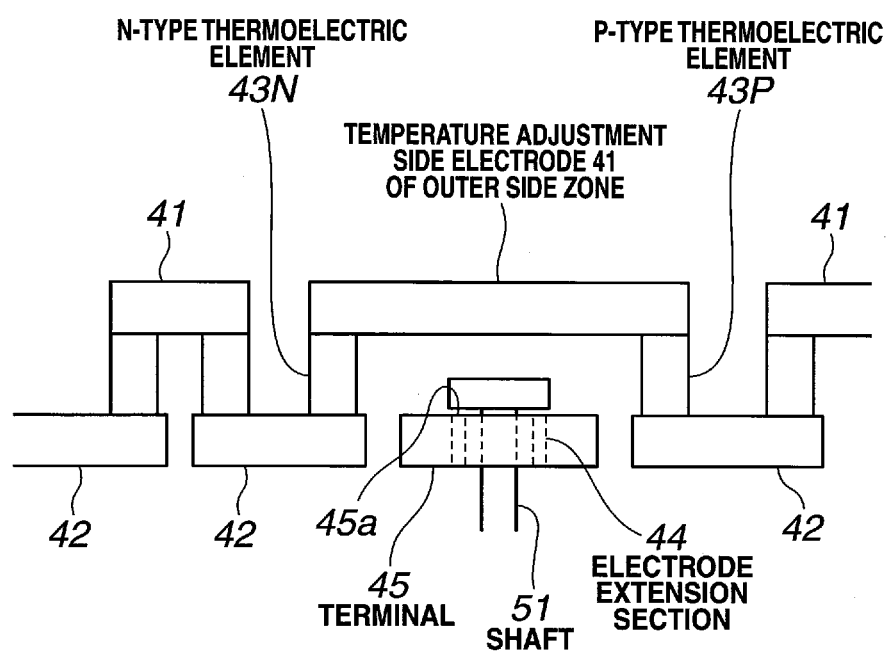
FIG. 9 is a view along arrow A in FIG. 8.

In other words, as FIG. 7 shows, with additional reference to FIG. 8 and FIG. 9, terminals 45 are provided via electrode extension sections 44 to the heat exchange plate side electrodes 42 in the inner side zones 11, 12, 13 apart from the outermost size zone 14, of the four zones 11, 12, 13, 14. The terminals 45 of the zones 11, 12, 13, 14, are disposed outside the outermost zone 14, in other words, outside the thermoelectric module 40 (see FIG. 7).

Figure 2B:
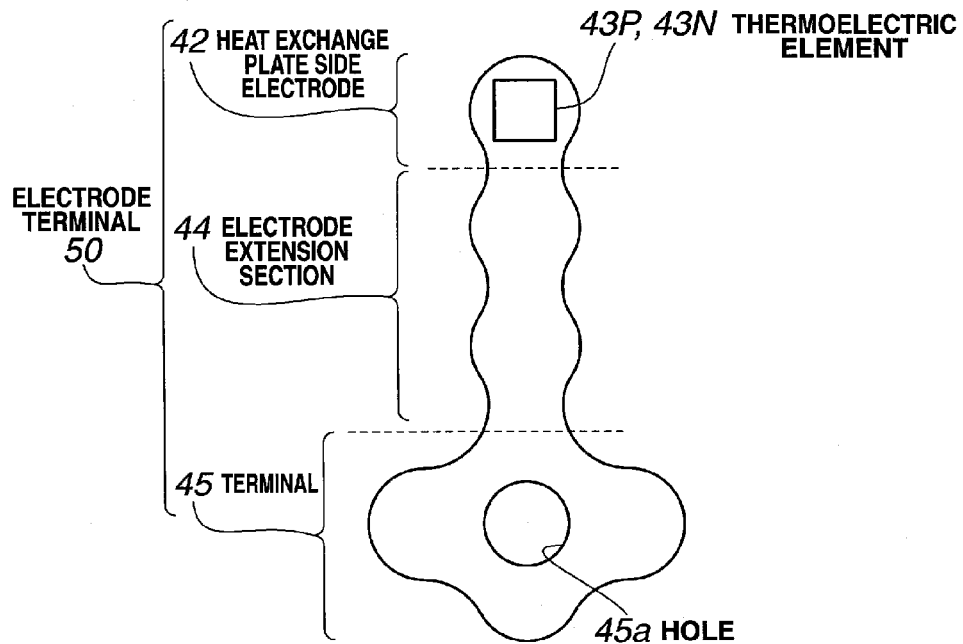
FIG. 2B is a schematic drawing of an electrode terminal.

As shown in FIG. 2B, a heat exchange plate side electrode 42, an electrode extension section 44 and a terminal 45 are formed in an integrated fashion and together constitute an electrode terminal 50. The heat exchange plate side electrode 42, the electrode extension section 44 and the terminal 45 may be formed as separate components and the electrode terminal 50 may be composed by connecting these parts together.

The electrode extension sections 44 are disposed at positions sandwiched between mutually adjacent thermoelectric elements 43P and 43N, and under the temperature adjustment electrodes 41 which span thereover (see FIG. 8 and FIG. 9).

In FIG. 8, the electrode terminals 50 of the innermost side zone 11 are depicted as a representative example. The electrode extension sections 44 constituting the electrode terminals 50 of the zone 11 are each disposed in a position sandwiched between the respective thermoelectric elements 43P, 43N of the outer zones 12, 13, 14, and under the temperature adjustment electrodes 41 of the outer side zones 12, 13, 14 which span thereover. The terminals 45 of zone 11 are disposed outside the outermost zone 14, in other words, in the portion of the thermoelectric module plate 140 which does not function as a thermoelectric module 40 (outside the diagonally hatched region in FIG. 6). A hole 45a is formed in each terminal 45.

On the other hand, as shown in FIG. 6, holes 30a are formed in the heat exchange plate 30. Electric current conducting shafts 51 are passed through the holes 45a in the terminals 45 and the holes 30a in the heat exchange plate 30. An electric signal line (not illustrated) is electrically connected from the exterior to the shafts 51, and an electric current is passed through the heat exchange plate side electrodes 42.

Figure 10:
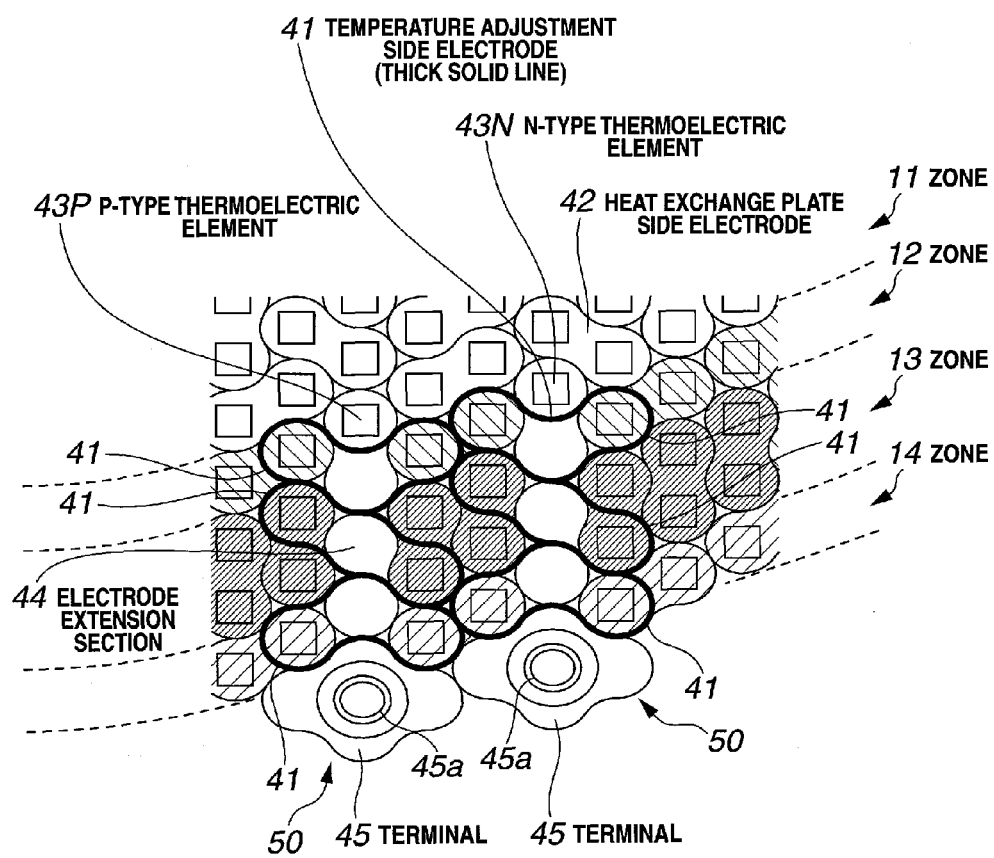
FIG. 10 shows a partial enlarged view of a cross-section of a thermoelectric module, substituting the perspective view in FIG. 8 with a plan view.

FIG. 10 is an enlarged view of a portion of the thermoelectric module 40 and shows a lateral cross-sectional view of FIG. 8 viewed in a horizontal cross-section. In FIG. 10, the temperature adjustment electrodes 41 which span over the electrode extension sections 44 are depicted by thick solid lines in order to simplify the description.

As shown in FIG. 10, in the portion of the zones 12, 13, 14 where the electrode extension sections 44 are located, the temperature adjustment electrodes 41 are disposed in a state of spanning over the electrode extension sections 44. Therefore, in the portion of the zones 12, 13, 14 where the electrode extension sections 44 are located, the function of the thermoelectric module 40 is maintained, without any interruption of the temperature adjustment function of the thermoelectric module 40.

The terminals 45 of the zone 11 have been described here, but the same applies to the terminals 45 of the other zones 12 and 13, and in the portions where the electrode extension sections 44 of the zones 12, 13, 14 are located, the function of the thermoelectric module 40 is maintained without any interruption.

However, it is not possible to arrange the thermoelectric elements 43P, 43N in the portions where the electrode extension sections 44 are located. Hence, there is a slight decline in the temperature adjustment function due to this.

Furthermore, the terminals 45 of each of the zones 11, 12, 13, 14 are disposed outside the outermost zone 14. The outer side of the outermost zone 14 is a portion which does not in principle function as a thermoelectric module 40, and although the terminals 45 are disposed in this place, this does not affect the functions of the thermoelectric module 40.

Consequently, according to the first embodiment, it is possible to suppress decline in the temperature adjustment function due to the presence of the terminals 45, to minimize the effects on the temperature distribution of the zones 11, 12, 13, 14, and to resolve problems such as localized decline in the function of the thermoelectric module 40 which has occurred in the prior art.

Figure 11A:
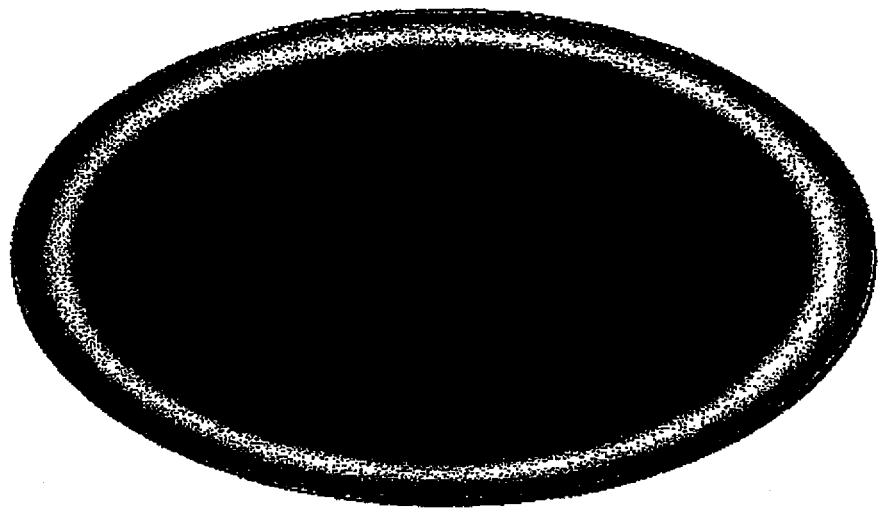
FIGS. 11A and 11B are respectively diagrams showing temperature distribution in a stage plane when a thermoelectric module is operated.
Figure 11B:
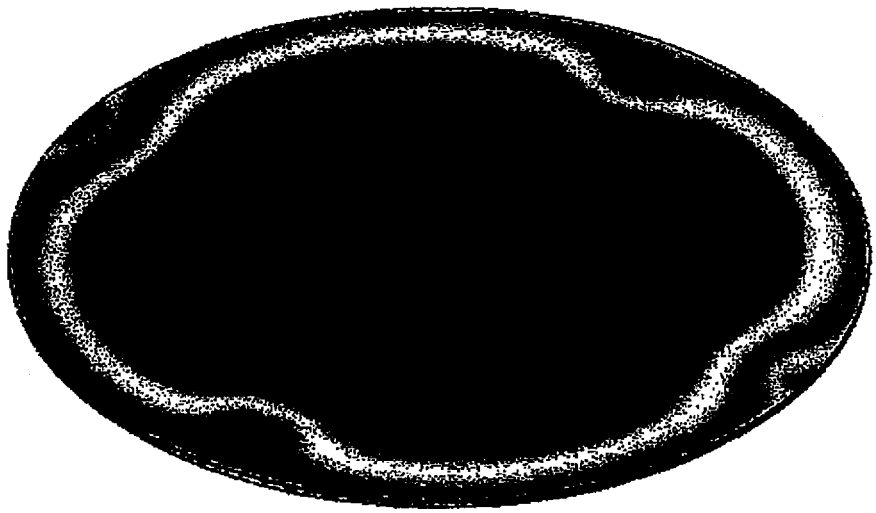

FIGS. 11A and 11B are diagrams showing a comparison of the temperature distribution in the plane of a stage 20 when the thermoelectric module 40 is operated, in the first embodiment and the prior art, respectively. The temperature density on the stage 20 is depicted by the gray density. The white portion of the stage 20 indicates a convenient reference temperature for describing the temperature distribution, and the temperature difference with respect to this reference temperature is depicted by tonal graduations from white to black. The higher the temperature compared to the reference temperature, or the lower the temperature compared to the reference temperature, the nearer the density becomes to black. The region inside the portion indicated by the white ring shape on the stage 20 is a region of high temperature compared to the reference temperature, and the darker the density, the higher the temperature. On the other hand, the region to the outside of the portion indicated by the white ring shape on the stage 20 is a region of low temperature compared to the reference temperature, and the darker the density, the lower the temperature.

Figure 3:
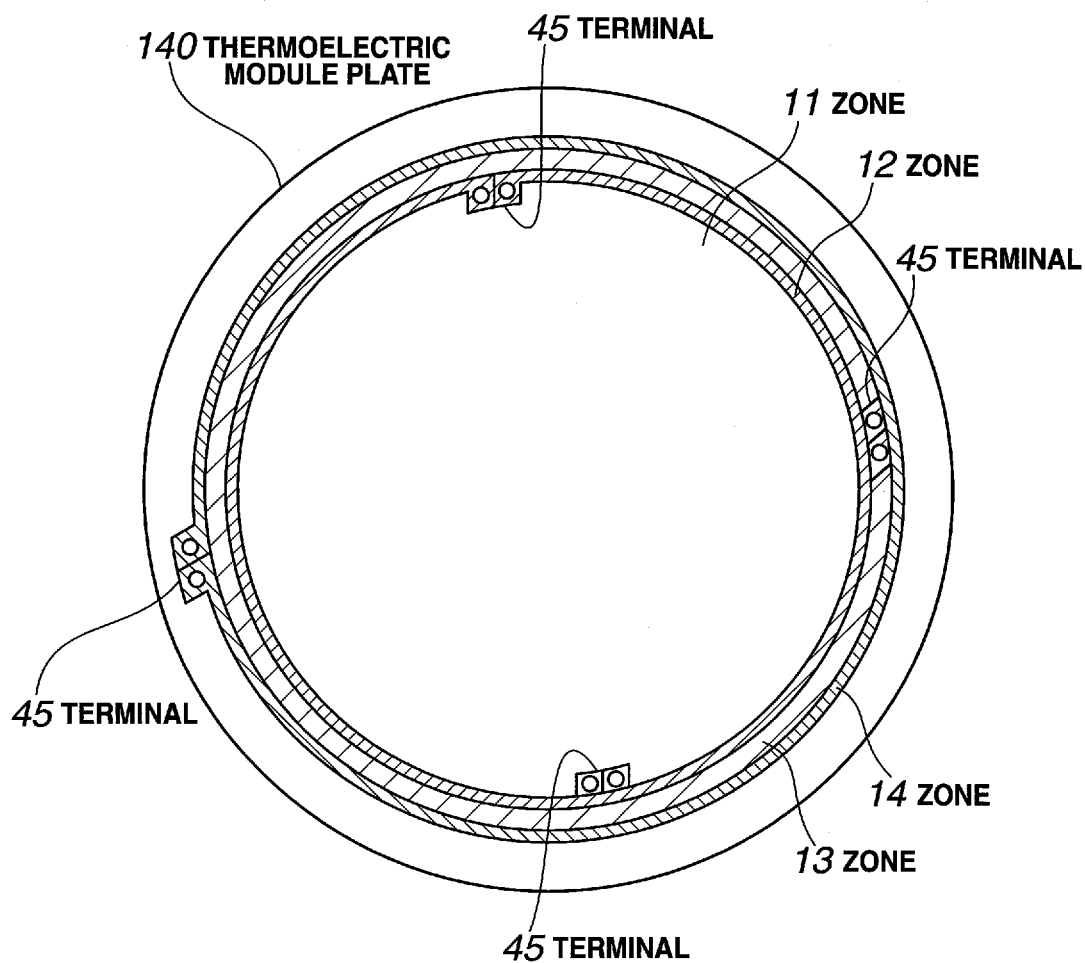
FIG. 3 is a plan diagram of a conventional thermoelectric module plate.
Figure 4:
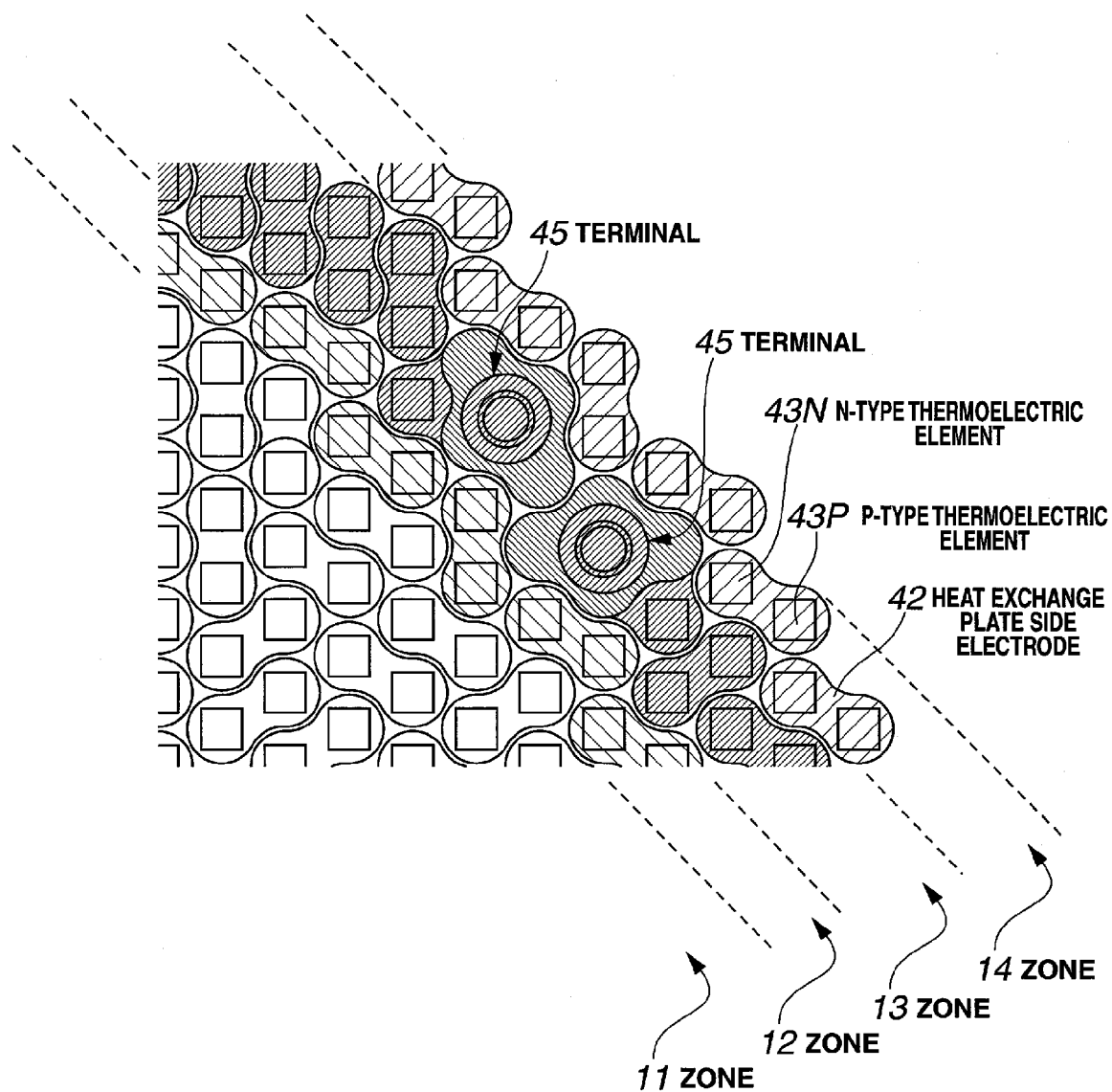
FIG. 4 is a partial enlarged view of a cross-section of a prior art thermoelectric module and shows an example of the arrangement of thermoelectric elements, heat exchange plate side electrodes and terminals electrically connected to heat exchange plate side electrodes.
Figure 5:
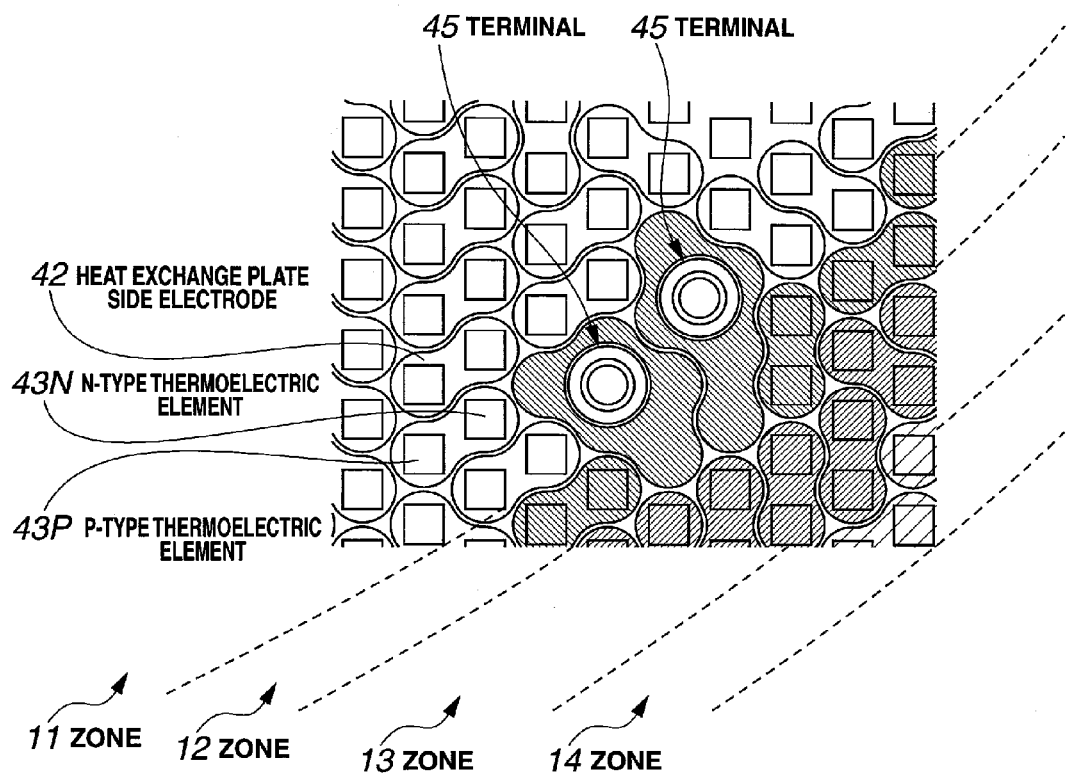
FIG. 5 is a partial enlarged view of a cross-section of a prior art thermoelectric module and shows an example of the arrangement of thermoelectric elements, heat exchange plate side electrodes and terminals electrically connected to heat exchange plate side electrodes.

As shown in FIG. 11B, in the case of the prior art, there are localized falls in temperature at the four locations where the terminals 45, 45, 45, 45 of the zones 11, 12, 13, 14 are located in FIG. 3, (namely, the region to the outside of the white ring in the FIG. 11B has broad localized black colored portions), indicating that the temperature distribution is irregular and the temperature adjustment function is impaired. On the other hand, in the case of the first embodiment, as shown in FIG. 11A, there is no localized fall in temperature in the plane of the stage 20 (the region to the outer side of the white ring in FIG. 11A does not show localized black-colored portions), and hence it can be seen that the temperature distribution is uniform in the plane and the temperature adjustment function is improved in comparison with the prior art.

In the first embodiment, a case where the thermoelectric module 40 is constituted by four zones is envisaged, but it is possible to apply the present invention in a similar fashion provided that the thermoelectric module 40 comprises at least two zones (for example, a zone 11 (inner side) and a zone 12 (outer side)).

In this case, terminals 45 are provided via electrode extension sections 44 for the heat exchange plate side electrodes 42 of at least one zone (zone 11), and the terminals 45 are arranged outside the outermost zone (zone 12).

Second Embodiment

In the first embodiment, a case is described where the terminals 45 of all zones 11, 12, 13, 14 are disposed outside the outermost zone 14. However, depending on the temperature adjustment apparatus 100 in which it is installed, it may be difficult to arrange terminals 45 on the outer side of the outermost zone 14, due to reasons such as lack of spare surface area on the thermoelectric module plate 140.

Therefore, in this second embodiment, the terminals 45 of all of the zones 11, 12, 13, 14 are arranged in the innermost zone 11, in view of the fact that the innermost zone 11 has the largest surface area and has the smallest effect on the function of the thermoelectric module 40.

Figure 12:
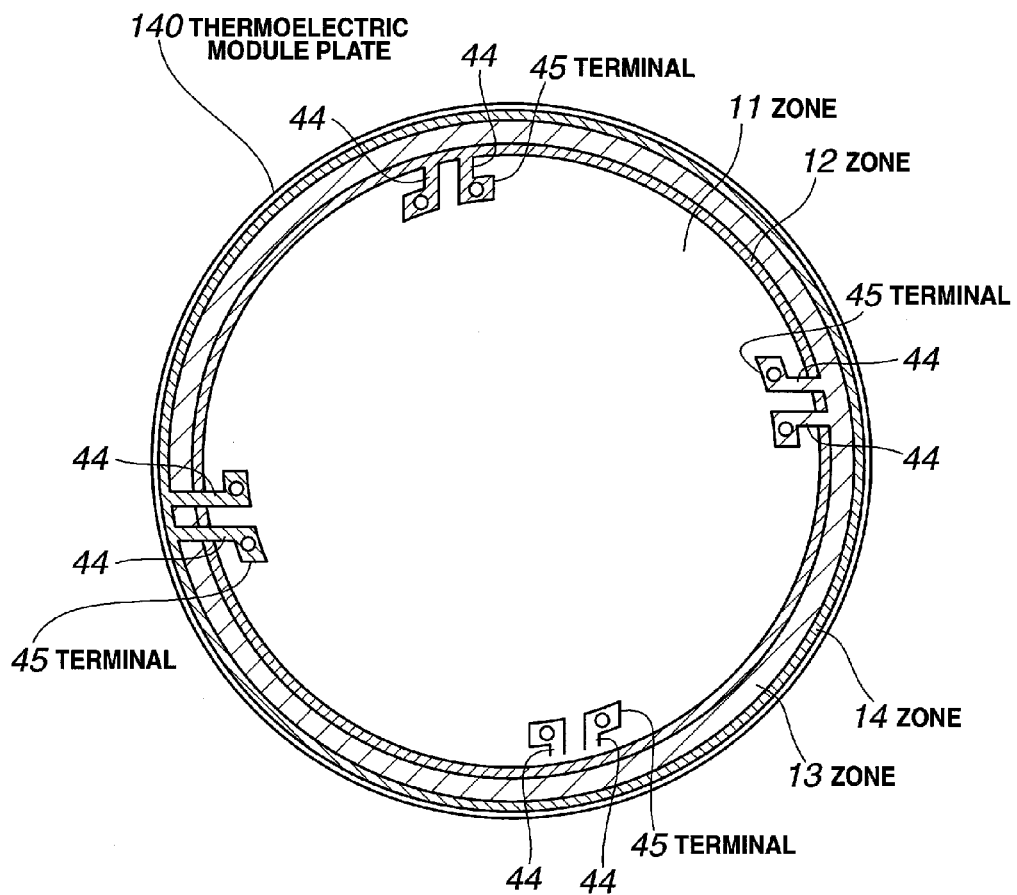
FIG. 12 is a plan diagram of a thermoelectric module plate according to a second embodiment.

FIG. 12 is a plan diagram of a thermoelectric module plate 140 according to the second embodiment. In the following description, constituent portions which overlap with the first embodiment are omitted and only the different constituent portions are described.

As shown in FIG. 12, the terminals 45 are provided via electrode extension sections 44 to the heat exchange plate side electrodes 42 of the four zones 11, 12, 13, 14 (see FIG. 2B). Furthermore, the terminals 45 of all zones 11, 12, 13, 14 are disposed in the innermost zone 11.

Similarly to the first embodiment, the electrode extension sections 44 are disposed at positions sandwiched between mutually adjacent thermoelectric elements 43P and 43N, and under the temperature adjustment electrodes 41 which span thereover (see FIG. 9).

Figure 13:
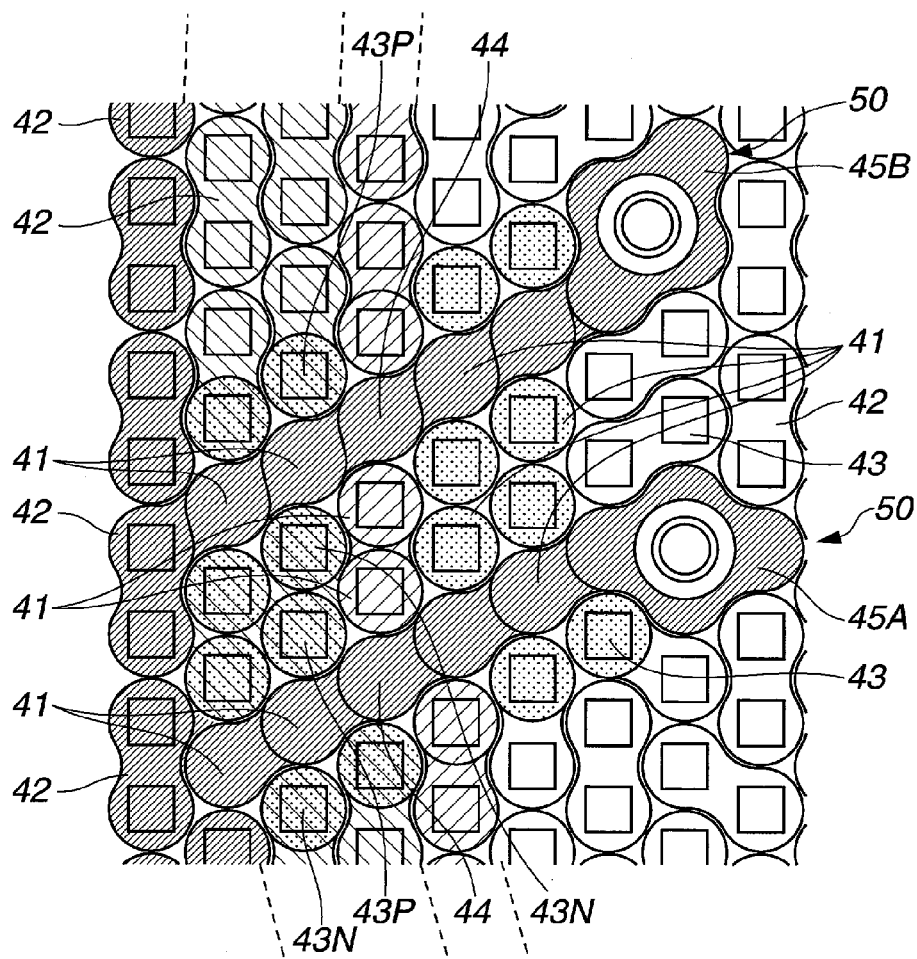
FIG. 13 is a diagram showing a partial enlarged view of a cross-section of a thermoelectric module.

FIG. 13 corresponds to FIG. 10 and shows partially an enlarged view of a plan diagram of the thermoelectric module 40.

In FIG. 13, the electrode terminals 50 of the outermost side zone 14 are depicted as a representative example. The electrode extension sections 44 constituting the electrode terminals 50 of the zone 14 are each disposed in a position sandwiched between the respective thermoelectric elements 43P, 43N of the inner zones 13, 12, 11, and under the temperature adjustment electrodes 41 of the inner zones 13, 12, 11 which span thereover. Furthermore, the terminals 45 of the zone 14 are disposed in the innermost zone 11.

Electrode extension sections 44 are provided respectively on the positive terminal 45A and the negative terminal 45B.

Positive terminals 45A provided with an electrode extension section 44 and negative terminals 45B provided with an electrode extension section 44 are arranged in alternating fashion, mutually separated by a distance corresponding to two thermoelectric elements 43.

Furthermore, the positive terminals 45A provided with an electrode extension section 44 and the negative terminals 45B provided with an electrode extension section 44 are disposed at positions separated by a distance corresponding to two thermoelectric elements 43 from the boundary with the zone 11 having the largest surface area.

The description here relates to the electrode terminal 50 of the outermost zone 14, but the positive terminals 45A and the negative terminals 45B of the other zones 13, 12, 11 are also arranged so as to be mutually separated by similar distances, via the electrode extension section 44, at positions which are separated by a similar distance from the boundary of the zone 11 which has the largest surface area.

According to the second embodiment, similarly to the first embodiment, in the portion of the zones 12, 13, 14 where the electrode extension sections 44 are located, the temperature adjustment electrodes 41 are disposed in a state of spanning over the electrode extension sections 44. Therefore, in the portion of the zones 12, 13, 14 where the electrode extension sections 44 are located, the function of the thermoelectric module 40 is maintained, without any interruption of the function of the thermoelectric module 40.

Furthermore, the terminals 45 of all zones 11, 12, 13, 14 are disposed in the innermost zone 11. The innermost zone 11 has the largest surface area, and there is little effect on the temperature distribution in that zone 11 when terminals 45 of the same size are arranged, compared to the other zones 12, 13, 14 which have a smaller surface area.

Therefore, according to the second embodiment, it is possible to suppress decline in the temperature adjustment function due to the presence of the terminals 45, and the effects on the temperature distribution of the zones 11, 12, 13, 14 can be minimized.

Figure 14:
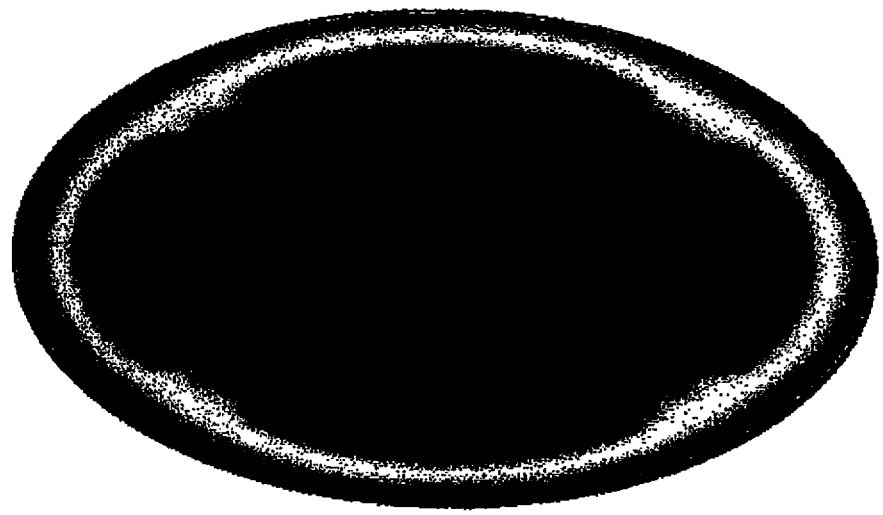
FIG. 14 is in-plane temperature distribution chart during operation of a thermoelectric module plate according to a second embodiment.

FIG. 14 is a chart of in-plane temperature distribution according to a second embodiment, and shows the temperature distribution in the plane of the stage 20 when the thermoelectric module 40 is operated, similarly to FIG. 11. This chart is compared with the prior art technology shown in FIG. 11B. In the case of the prior art, there are localized falls in temperature at the four locations where the terminals 45, 45, 45, 45 of the zones 11, 12, 13, 14 are provided in FIG. 3, (namely, the region to the outside of the white ring in the FIG. 11B has broad localized black colored portions), indicating that the temperature distribution is irregular and the temperature adjustment function is impaired. On the other hand, in the case of the second embodiment, as shown in FIG. 14, there is no localized fall in temperature in the plane of the stage 20 (the region to the outer side of the white ring in FIG. 14 does not show localized black-colored portions), and hence it can be seen that the temperature distribution is uniform in the plane and the temperature adjustment function is improved in comparison with the prior art.

Figure 15A:
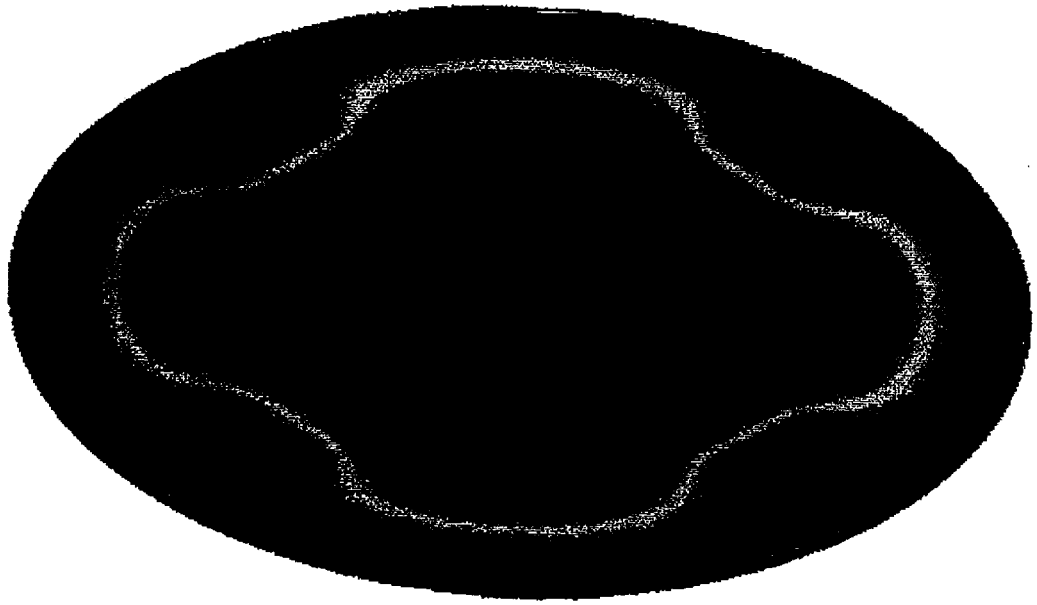
FIGS. 15A and 15B are in-plane temperature distribution charts showing a comparison between a case where the positive terminals and the negative terminals are disposed at positions separated from the boundary of the zone having the largest surface area, via electrode extension sections, and mutually separated from each other (second practical example), and a case where similar positive terminals and negative terminals are arranged at positions adjacent to the boundary of the zone having the largest surface area and mutually adjacent to each other (comparison example)
Figure 15B:
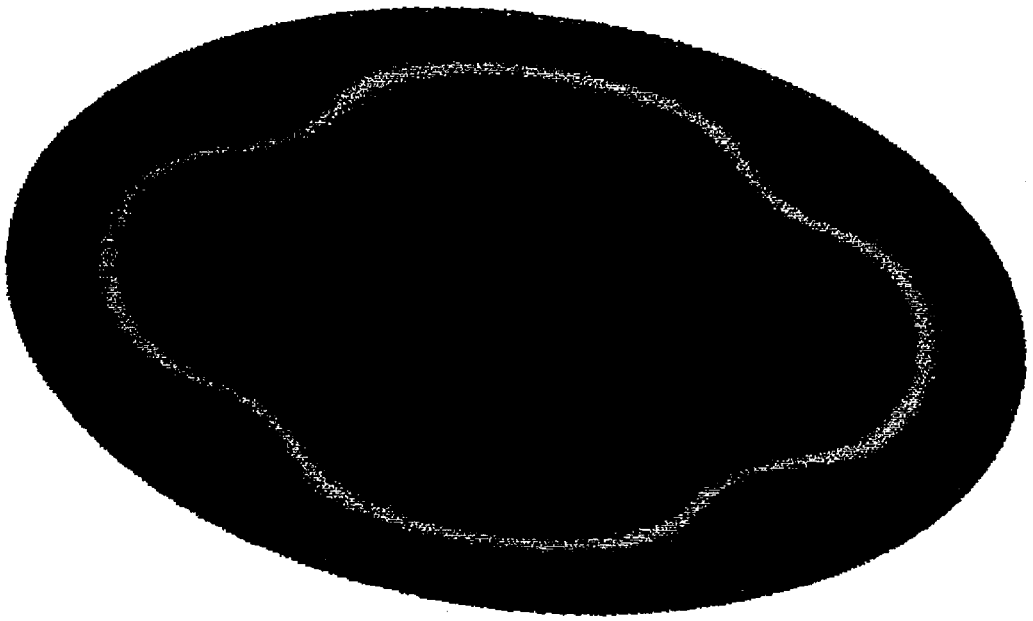

FIGS. 15A and 15B are temperature distribution charts showing a comparison between a case where the positive terminals 45A and the negative terminals 45B are disposed at positions separated from the boundary of the zone 11 having the largest surface area, via electrode extension sections 44, and mutually separated from each other (second embodiment; FIG. 13), and a case where similar positive terminals 45A and negative terminals 45B are arranged at positions on the boundary of the zone 11 having the largest surface area and mutually adjacent to each other (comparative example). In FIG. 15, the temperature on the stage 20 is depicted similarly to FIG. 11.

Figure 16:
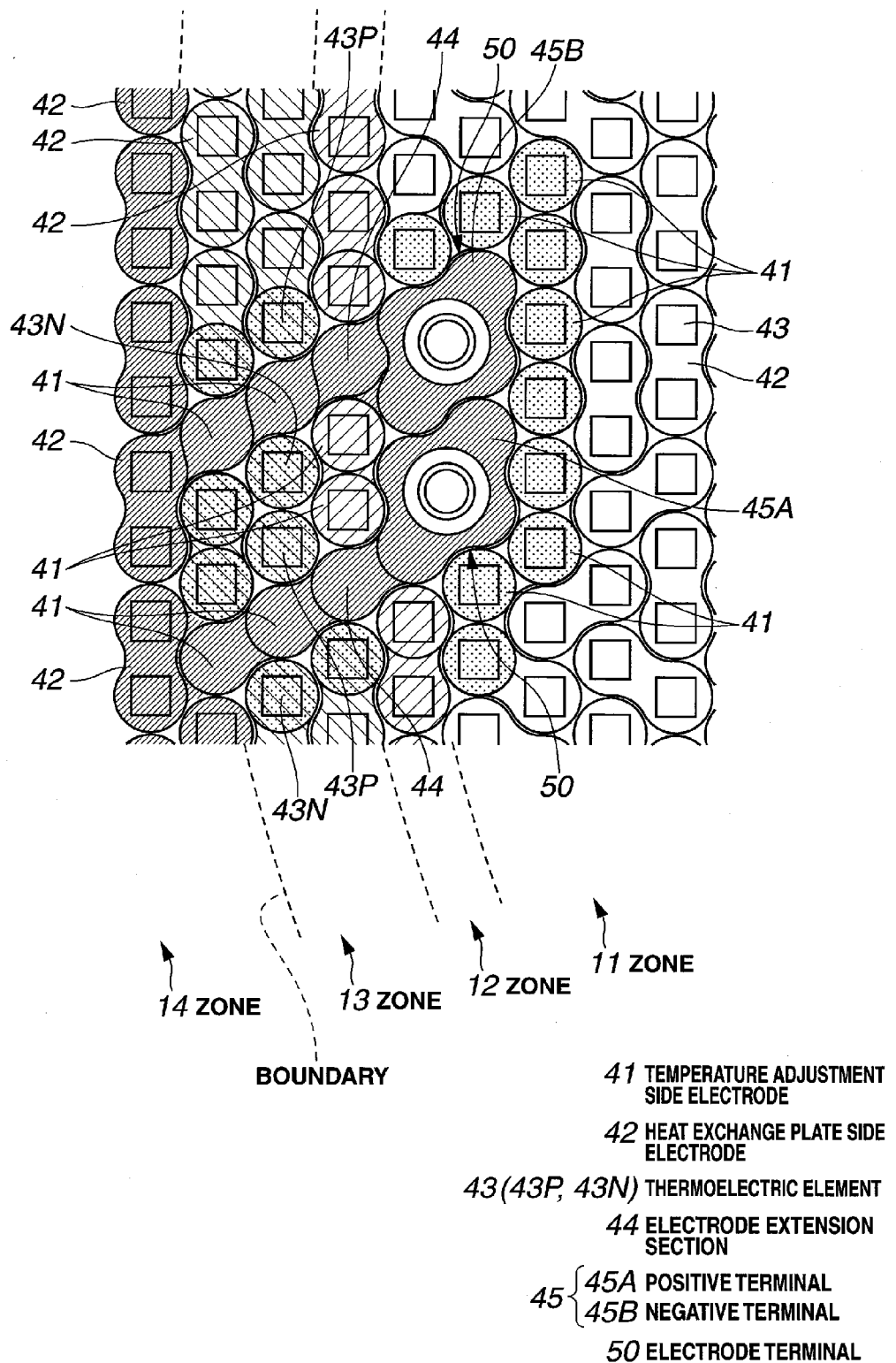
FIG. 16 shows a comparative example of the second embodiment.

FIG. 16 shows a comparative example which corresponds to FIG. 13. In the comparative example, the positive terminals 45A and the negative terminals 45B in FIG. 12 are arranged as shown in FIG. 16.

As FIG. 16 indicates, the positive terminals 45A provided with an electrode extension section 44 and the negative terminals 45B provided with an electrode extension section 44 are arranged in mutually adjacent fashion.

Furthermore, the positive terminals 45A provided with an electrode extension section 44 and a negative terminals 45B provided with an electrode extension section 44 are disposed at positions adjacent to the boundary of the zone 11 which has the largest surface area.

As shown in FIG. 15B, in the case of the comparative example, there are localized falls in temperature at the four locations where the terminals 45, 45, 45, 45 of the zones 11, 12, 13, 14 are located, (namely, the region to the outside of the white ring in the FIG. 15B has broad localized black colored portions), and a marked cool spot appear. Consequently, it can be seen that the temperature distribution becomes irregular and the temperature adjustment function is impaired. On the other hand, as shown in FIG. 15A, in the case of the second embodiment, the periphery of the cool spot in the plane of the stage 20 is broader than the case of the first embodiment shown in FIG. 11A (the region to the outside of the white ring is larger compared to FIG. 11A), but the temperature fall is restricted compared to the comparative example shown in FIG. 15B (there are no localized black portions in the region to the outside of the white ring in FIG. 15A). Therefore, it can be seen that the temperature distribution in the plane is uniform compared to the comparative example, and the temperature adjustment function is improved compared to the comparative example.

The zone 11 having the largest surface area is not liable to be affected by a cool spot, and the effects thereof can be diminished. Consequently, it is considered that arranging the positive terminals 45A and the negative terminals 45B so as to be separated by a distance corresponding to at least two thermoelectric elements 43 from the boundary of the zone 11 having the largest surface area, and so as to be separated from each other by a distance corresponding to at least two thermoelectric elements 43 is effective in maintaining a uniform temperature distribution.

In the second embodiment, a case where the thermoelectric module 40 is constituted by four zones is envisaged, but it is possible to apply the present invention in a similar fashion provided that the thermoelectric module 40 comprises at least three zones (for example, a zone 11 (innermost side), a zone 12, and a zone 13 (outermost side)).

In this case, terminals 45 are provided via electrode extension sections 44 to the heat exchange plate side electrodes 42 of at least one zone (for example, zone 13), and the terminals 45 are arranged in the innermost zone (zone 11).

In FIG. 12, electrode extension sections 44 are provided on the terminals 45 of all of the zones 11, 12, 13, 14, but it is also possible to connect the terminals 45 directly to the heat exchange plate side electrodes 42 of the innermost zone 11 and the zone 12 which is adjacent to this zone 11, without providing electrode extension sections 44.

Third Embodiment

In the second embodiment, a case is described where the terminals 45 of all zones 11, 12, 13, 14 are disposed in the innermost zone 11. However, depending on the temperature adjustment apparatus 100 where the module is installed, a zone other than the innermost zone 11 may have the largest surface area.

Therefore, in this third embodiment, the terminals 45 of all of the zones 11, 12, 13, 14 are arranged in the zone 12 having the largest surface area, in view of the fact that a zone other than the innermost zone 11, namely, the zone 12, has the largest surface area and hence the effect on the function of the thermoelectric module 40 is smallest in this zone 12.

Figure 17:
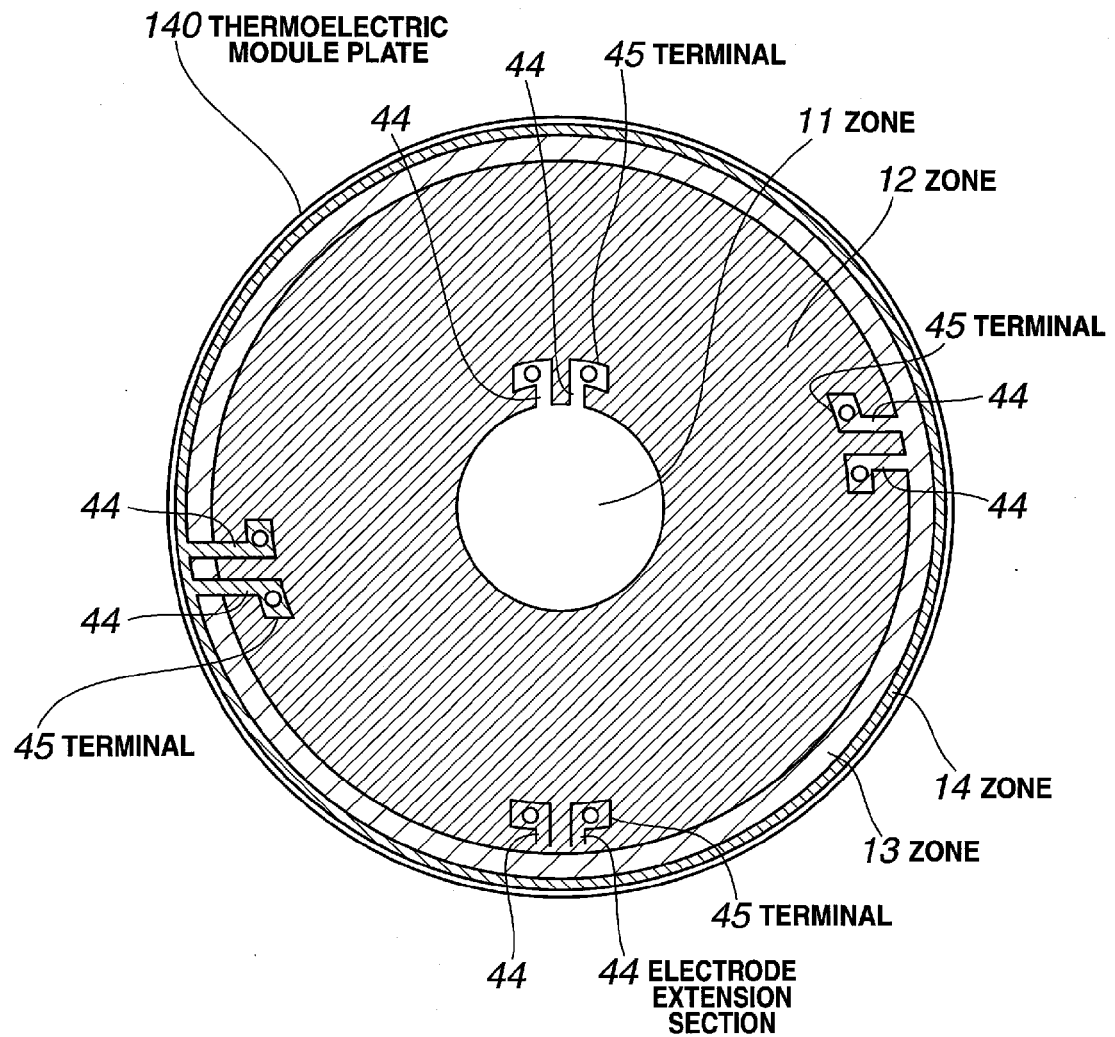
FIG. 17 is a plan diagram of a thermoelectric module plate according to a third embodiment.

FIG. 17 is a plan diagram of a thermoelectric module plate 140 according to the third embodiment. In the following description, constituent portions which overlap with the first embodiment or the second embodiment are omitted and only the different constituent portions are described.

As shown in FIG. 17, the terminals 45 are provided via electrode extension sections 44 to the heat exchange plate side electrodes 42 of the four zones 11, 12, 13, 14 (see FIG. 2B). Furthermore, the terminals 45 of all zones 11, 12, 13, 14 are disposed in the zone 12 which has the largest surface area.

Similarly to the first embodiment and the second embodiment, the electrode extension sections 44 are disposed at positions sandwiched between mutually adjacent thermoelectric elements 43P and 43N, and under the temperature adjustment electrodes 41 which span thereover (see FIG. 9).

Similarly to FIG. 13, the positive terminals 45A provided with an electrode extension section 44 and the negative terminals 45B provided with an electrode extension section 44 are arranged in alternating fashion, separated by a distance corresponding to two thermoelectric elements 43.

Furthermore, the positive terminals 45A provided with an electrode extension section 44 and the negative terminals 45B provided with an electrode extension section 44 are disposed at positions separated by a distance corresponding to two thermoelectric elements 43 from the boundary of the zone 12 having the largest surface area, rather than the zone 11 in FIG. 13.

According to the third embodiment, similarly to the first embodiment and the second embodiment, in the portion of the zones 12, 13 where the electrode extension sections 44 are located, the temperature adjustment electrodes 41 are disposed in a state of spanning over the electrode extension sections 44. Therefore, in the portion of the zones 12, 13 where the electrode extension sections 44 are located, the function of the thermoelectric module 40 is maintained, without any interruption of the function of the thermoelectric module 40.

Furthermore, the terminals 45 of the zones 11, 12, 13, 14 are disposed in the zone 12 having the largest surface area and the effect on the temperature distribution in this zone 12 when terminals 45 of the same size are disposed therein is small compared to the other zones 11, 13, 14, where the surface area is smaller.

Therefore, according to the third embodiment, it is possible to suppress decline in the temperature adjustment function due to the presence of the terminals 45, and the effects on the temperature distribution of the zones 11, 12, 13, 14 can be minimized.

In the third embodiment, a case where the thermoelectric module 40 is constituted by four zones is envisaged, but it is possible to apply the present invention in a similar fashion provided that the thermoelectric module 40 comprises at least three zones (for example, a zone 11 (innermost side), a zone 12 (zone of largest surface area), and a zone 13 (outermost side)).

In this case, terminals 45 are provided via electrode extension sections 44 to the heat exchange plate side electrodes 42 of at least one zone (for example, zone 13), and the terminals 45 are arranged in the zone having the largest surface area (zone 12).

In FIG. 17, electrode extension sections 44 are provided on the terminals 45 of all of the zones 11, 12, 13, 14, but it is also possible to connect the terminals 45 directly to the heat exchange plate side electrode 42, without providing electrode extension sections 44, in the zone 12 having the largest surface area, and in the zone 11 and the zone 13 which are adjacent to the zone 12.

Fourth Embodiment

In the first embodiment, a case is described in which the terminals 45 of all of the zones 11, 12, 13, 14 are disposed outside the outermost zone 14 and in the second embodiment, a case is described in which the terminals 45 of all of the zones 11, 12, 13, 14 are disposed in the innermost zone 11. However, in order to keep the length of the electrode extension sections 44 small, it is also possible to allocate the arrangement positions of the terminals 45 to the inner side and the outer side, depending on whether the corresponding zone is on the inner side or the outer side.

In this fourth embodiment, of the four zones 11, 12, 13, 14, the terminals 45 of the outer side zones 13, 14 are arranged outside the outermost zone 14, and the terminals 45 of the inner side zones 11, 12 are arranged on the innermost zone 11.

Figure 18:
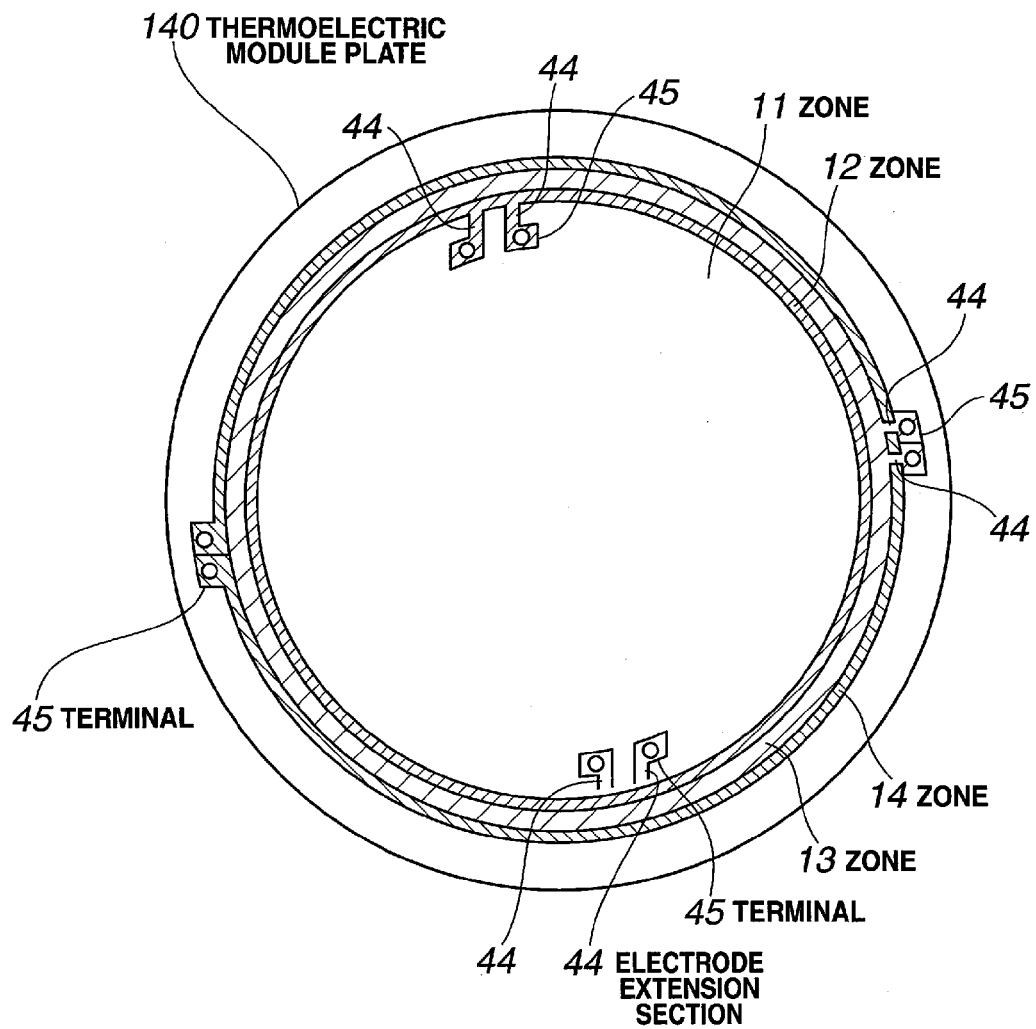
FIG. 18 is a plan diagram of a thermoelectric module plate according to a fourth embodiment.

FIG. 18 is a plan diagram of a thermoelectric module plate 140 according to the fourth embodiment. In the following description, constituent portions which overlap with the first embodiment, the second embodiment or the third embodiment are omitted and only the different constituent portions are described.

As shown in FIG. 18, the terminals 45 are provided via electrode extension sections 44 to the heat exchange plate side electrodes 42 of the four zones 11, 12, 13 apart from the outermost zone 14 (see FIG. 2B). The terminals 45 of the inner side zones 11, 12 are disposed on the innermost zone 11, and the terminals 45 of the outer side zones 13, 14 are disposed outside the outermost zone 14.

Similarly to the first embodiment, the second embodiment and the third embodiment, the electrode extension sections 44 are disposed at positions sandwiched between mutually adjacent thermoelectric elements 43P and 43N, and under the temperature adjustment electrodes 41 which span thereover (see FIG. 9).

Similarly to FIG. 13, the positive terminals 45A provided with an electrode extension section 44 and the negative terminals 45B provided with an electrode extension section 44 are arranged in alternating fashion, separated by a distance corresponding to two thermoelectric elements 43.

Furthermore, the positive terminals 45A provided with an electrode extension section 44 and the negative terminals 45B provided with an electrode extension section 44 are disposed at positions separated by a distance corresponding to two thermoelectric elements 43 from the boundary with the innermost zone 11.

According to the fourth embodiment, similarly to the first embodiment, the second embodiment and the third embodiment, in the portion of the zones 11, 14 where the electrode extension sections 44 are located, the temperature adjustment electrodes 41 are disposed in a state of spanning over the electrode extension sections 44. Therefore, in the portion of the zones 11, 14 where the electrode extension sections 44 are located, the function of the thermoelectric module 40 is maintained, without any interruption of the function of the thermoelectric module 40.

Furthermore, the terminals 45 of the zones 13, 14 are disposed outside the outermost zone 14. The outer side of the outermost zone 14 is a portion which does not in principle function as a thermoelectric module 40, and although the terminals 45 are disposed in this place, this does not affect the functions of the thermoelectric module 40.

Furthermore, the terminals 45 of all zones 11, 12 are disposed in the innermost zone 11. The innermost zone 11 has the largest surface area, and there is little effect on the temperature distribution in that zone 11 when terminals 45 of the same size are arranged, compared to the other zones 12, 13, 14 which have a smaller surface area.

Therefore, according to the fourth embodiment, it is possible to suppress decline in the temperature adjustment function due to the presence of the terminals 45, and the effects on the temperature distribution of the zones 11, 12, 13, 14 can be minimized.

Furthermore, according to this fourth embodiment, since the terminals 45 of the outer zone 13 are disposed outside the outer zone 14, and since the terminals 45 of the inner zones 11, 12 are disposed in the innermost zone 11, then it is possible to minimize the length of the electrode extension sections 44. Therefore, the effect of the electrode extension sections 44 on the temperature distribution can be kept small.

In the fourth embodiment, a case where the thermoelectric module 40 is constituted by four zones is envisaged, but it is possible to apply the present invention in a similar fashion provided that the thermoelectric module 40 comprises at least three zones (for example, a zone 11 (innermost side), a zone 12, and a zone 13 (outermost side)).

In this case, terminals 45 are provided via an electrode extension section 44 to the heat exchange plate side electrodes 42 of at least one zone (for example, zone 12), the terminals 45 of the outer zone (zones 12, 13) are disposed outside the outermost zone (zone 13), and the terminals 45 of the inner zone (zone 11) are disposed in the innermost zone (zone 11).

In FIG. 18, terminals 45 are provided via an electrode extension section 44 to the heat exchange plate side electrodes 42 of each of the zones 11, 12, 13 apart from the outermost zone 14, but it is also possible to connect the terminals 45 directly to the heat exchange plate side electrode 42 of the innermost zone 11, and the zone 12 which is adjacent to this zone 11, without providing electrode extension sections 44.

Fifth Embodiment

In the first to fourth embodiments described above, the positive terminal 45A and the negative terminal 45B of one zone (for example, zone 13) are led in the same direction (for example, the outward direction) via an electrode extension section 44 and are disposed at the same location (outside the outermost zone 14), but it is also possible to lead the positive terminal 45A and the negative terminal 45B of one zone (for example, zone 13) in respectively different directions via electrode extension sections 44 (an inward direction and an outward direction), and to dispose the terminals at different positions on the inner side and the outer side (for example, on the innermost zone 11, and outside the outermost zone 14).

Figure 19:
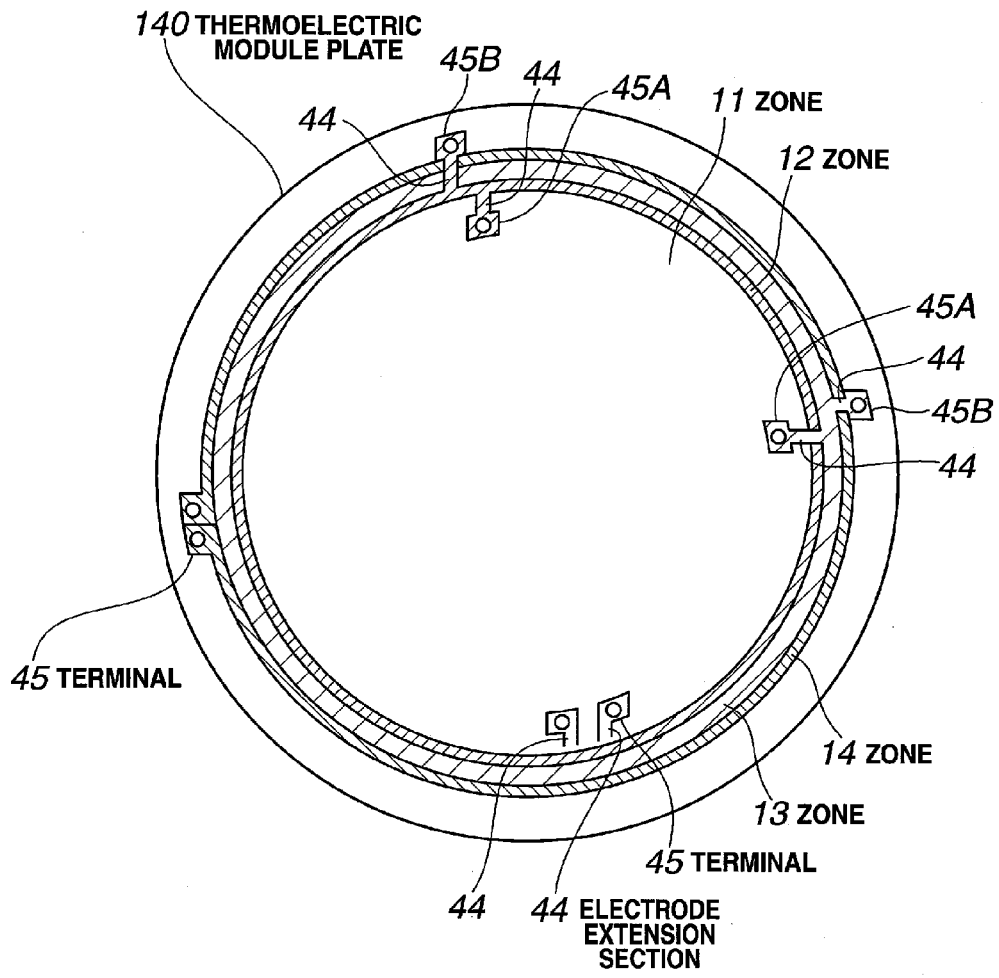
FIG. 19 is a plan diagram of a thermoelectric module plate according to a fifth embodiment.

FIG. 19 is a plan diagram of a thermoelectric module plate 140 according to the fifth embodiment. In the following description, constituent portions which overlap with the first embodiment, the second embodiment, the third embodiment or the fourth embodiment are omitted and only the different constituent portions are described.

As shown in FIG. 19, the terminals 45 are provided via electrode extension sections 44 to the heat exchange plate side electrodes 42 of the four zones 11, 12, 13 apart from the outermost zone 14 (see FIG. 2B).

The terminals 45 of the innermost zone 11 are disposed in the innermost zone 11.

The positive terminal 45A of zone 12 is disposed in the innermost zone 11 and the negative terminal 45B of the zone 12 is disposed outside the outermost zone 14.

The positive terminal 45A of zone 13 is disposed in the innermost zone 11 and the negative terminal 45B of the zone 13 is disposed outside the outermost zone 14.

The terminals 45 of the outermost zone 14 are disposed outside the outermost zone 14.

Similarly to the first embodiment, the second embodiment, the third embodiment and the fourth embodiment, the electrode extension sections 44 are disposed at positions sandwiched between mutually adjacent thermoelectric elements 43P and 43N, and under the temperature adjustment electrodes 41 which span thereover (see FIG. 9).

According to the fifth embodiment, similarly to the first embodiment, the second embodiment, the third embodiment and the fourth embodiment, in the portion of the zones 11, 12, 13, 14 where the electrode extension sections 44 are located, the temperature adjustment electrodes 41 are disposed in a state of spanning over the electrode extension sections 44. Therefore, in the portion of the zones 11, 12, 13, 14 where the electrode extension sections 44 are located, the function of the thermoelectric module 40 is maintained, without any interruption of the function of the thermoelectric module 40.

Furthermore, the negative terminals 45B of the zones 12, 13 and the terminals 45 of the zone 14 are disposed outside the outermost zone 14. The outer side of the outermost zone 14 is a portion which does not in principle function as a thermoelectric module 40, and although the terminals 45 are disposed in this place, this does not affect the functions of the thermoelectric module 40.

Furthermore, the terminals 45 of the zone 11 and the positive terminals 45A of the zones 12, 13 are disposed in the innermost zone 11. The innermost zone 11 has the largest surface area, and there is little effect on the temperature distribution in that zone 11 when terminals 45 and positive terminals 45A of the same size are arranged in the zone, compared to the other zones 12, 13, 14 which have a smaller surface area.

Therefore, according to the fifth embodiment, it is possible to suppress decline in the temperature adjustment function due to the presence of the terminals 45, and the effects on the temperature distribution of the zones 11, 12, 13, 14 can be minimized.

In the fifth embodiment, a case where the thermoelectric module 40 is constituted by four zones is envisaged, but it is possible to apply the present invention in a similar fashion provided that the thermoelectric module 40 comprises at least two zones (for example, a zone 11 (inner side) and a zone 12 (outer side)).

In this case, positive terminals 45A and negative terminals 45B are provided via an electrode extension section 44 to the heat exchange plate side electrodes 42 of at least one zone (for example, zone 12), the positive terminals 45A being arranged in the innermost zone (zone 11) and the negative terminals 45B being arranged in the outer zone 13.

In FIG. 19, electrode extension sections 44 are provided on the terminals 45 of each of the zones 11, 12, 13 apart from the outermost zone 14, but it is also possible to connect the positive terminal 45A directly to the heat exchange plate side electrode 42, without providing an electrode extension section 44, in the case of the positive terminal 45A of the innermost zone 11 and the positive terminal 45A of the zone 12 which is adjacent to this zone 11.

In the fifth embodiment, the positive terminals 45A are led toward the inner side and the negative terminals 45B are led toward the outer side, but it is also possible to adopt an implementation in which the positive terminals 45A are led toward the outer side and the negative terminals 45B are led toward the inner side.

In the respective embodiments, an apparatus for adjusting the temperature of a silicon wafer was envisaged, but the present invention can also be applied to a case of adjusting the temperature of various temperature adjustment objects, such as other substrates.

EXPLANATION OF REFERENCE NUMERALS 11, 12, 13, 14 . . . Zone, 20 . . . Stage, 30 . . . Heat exchange plate, 40 . . . thermoelectric module, 41 . . . Temperature adjustment side electrode, 42 . . . Heat exchange plate side electrode, 43P, 43N . . . Thermoelectric module, 44 . . . electrode extension section, 45 (45A, 45B) . . . Terminal (Positive terminal, Negative terminal), 50 . . . Electrode terminal

What is claimed is:

1. A temperature adjustment apparatus, which comprises: a stage on which a temperature adjustment object is placed, a heat exchange plate, and a thermoelectric module provided on a thermoelectric module plate, the thermoelectric module together with the thermoelectric module plate being arranged between the stage and the heat exchange plate, the thermoelectric module having a stage side facing the stage and a heal exchange plate side facing the heat exchange plate, wherein: the thermoelectric module includes a plurality of zones including an innermost zone having a circular shape and arranged closest to a center of the stage, and one or more outer zones that are ring-shaped and concentrically arranged with the innermost zone, the innermost zone and the one or more outer zones being configured to provide uninterrupted temperature adjustment, each zone including thermoelectric elements having one end face connected to a temperature adjustment side electrode being disposed on the stage side of the thermoelectric module and another end face connected to a heat exchange plate side electrode being disposed on the heat exchange plate side of the thermoelectric module, the temperature adjustment apparatus and the thermoelectric module are configured to perform temperature adjustment of the temperature adjustment object by passing an electric current to the heat exchange plate side electrode through at least one terminal provided in each zone of the plurality of zones formed from the center toward an outer side of the stage, the thermoelectric module being further configured to perform temperature adjustment independently in each zone of the plurality of zones from the center toward the outer side of the stage by passing the electric current through the one terminal of each zone, the one terminal of the innermost zone having an end provided with an electrode extension section connected to the heat exchange plate side electrode, the electrode extension section electrically connecting the thermoelectric elements in the innermost zone to the thermoelectric elements in another zone of the plurality of zones other than the innermost zone, the electrode extension section of the one terminal of the innermost zone is sandwiched between adjacent thermoelectric elements disposed in other zones of the plurality of zones, the electrode extension section being disposed at a position over which the temperature adjustment side electrodes are connected to the another end face of each of the adjacent thermoelectric elements, the one terminal and the electrode extension section are included in the thermoelectric module plate, and the one terminal of the innermost zone has another end disposed in an outer side region of the one or more outer zones and/or in a zone of the plurality of zones having the largest surface area.

2. The temperature adjustment apparatus according to claim 1, wherein
each zone of the plurality of zones has another terminal provided, via an electrode extension section, to the heat exchange plate side electrode of the thermoelectric module plate, and the another terminal of each zone of the plurality of zones has another end disposed in the outer side region of the outermost zone.

3. The temperature adjustment apparatus according to claim 1, wherein the ends of the one terminal of all of the zones are disposed in the innermost zone.

4. The temperature adjustment apparatus according to claim 1, wherein the another ends of the one terminal of all of the zones are disposed in the zone having the largest surface area.

5. The temperature adjustment apparatus according to claim 2, wherein the another ends of the terminals of the outermost zone of the plurality of zones are disposed in the outer side region of the outermost zone, and the ends of the terminals of the innermost zone are disposed in the innermost zone.

6. The temperature adjustment apparatus according to claim 1, wherein
the terminals of each zone comprise a positive terminal and a negative terminal,
the electrode extension sections are provided respectively to the positive terminal and the negative terminal, and
one of the positive and negative terminals of at least one zone is disposed in the innermost zone via a corresponding electrode extension section, and another one of the positive and negative terminals is disposed in the outer side region of the outermost zone via a corresponding electrode extension section.

7. The temperature adjustment apparatus according to claim 3, wherein
the terminals of each zone comprise a positive terminal and a negative terminal,
the electrode extension sections are provided respectively to the positive terminal and the negative terminal of the terminals, and
each positive and negative terminal is provided with a corresponding electrode extension section and disposed at positions mutually separated by a distance corresponding to at least two thermoelectric elements.

8. The temperature adjustment apparatus according to claim 4, wherein
the terminals of each zone comprise a positive terminal and a negative terminal,
the electrode extension sections are provided respectively to the positive terminal and the negative terminal, and
each positive and negative terminal is provided with a corresponding electrode extension section and disposed at positions mutually separated by a distance corresponding to at least two thermoelectric elements.

9. The temperature adjustment apparatus according to claim 4, wherein
the terminals of each zone comprise a positive terminal and a negative terminal,
the electrode extension sections are provided respectively to the positive terminal and the negative terminal, and
each positive and negative terminal is provided with a corresponding electrode extension section and disposed at positions mutually separated by a distance corresponding to at least two thermoelectric elements from a boundary of a zone having a largest surface area.

10. The temperature adjustment apparatus according to claim 1, wherein the terminals and the heat exchange plate have holes, and the temperature adjusting apparatus further comprises shafts for passing the electric current which are inserted through the holes in the terminals and the heat exchange plate.

11. The temperature adjustment apparatus according to claim 2, wherein the terminals and the heat exchange plate have holes, and the temperature adjusting apparatus further comprises shafts for passing the electric current which are inserted through the holes in the terminals and the heat exchange plate.

12. The temperature adjustment apparatus according to claim 3, wherein the terminals and the heat exchange plate have holes, and the temperature adjusting apparatus further comprises shafts for passing the electric current which are inserted through the holes in the terminals and the heat exchange plate.

13. The temperature adjustment apparatus according to claim 4, wherein the terminals and the heat exchange plate have holes, and the temperature adjusting apparatus further comprises shafts for passing the electric current which are inserted through the holes in the terminals and the heat exchange plate.

14. The temperature adjustment apparatus according to claim 5, wherein the terminals and the heat exchange plate have holes, and the temperature adjusting apparatus further comprises shafts for passing the electric current which are inserted through the holes in the terminals and the heat exchange plate.

15. The temperature adjustment apparatus according to claim 1, wherein the heat exchange plate side electrode, the electrode extension section and the terminal are formed in an integrated fashion.

16. The temperature adjustment apparatus according to claim 2, wherein the heat exchange plate side electrode, the electrode extension section and the terminal are formed in an integrated fashion.

17. The temperature adjustment apparatus according to claim 3, wherein the heat exchange plate side electrode, the electrode extension section and the terminal are formed in an integrated fashion.

18. The temperature adjustment apparatus according to claim 4, wherein the heat exchange plate side electrode, the electrode extension section and the terminal are formed in an integrated fashion.

19. The temperature adjustment apparatus according to claim 5, wherein the heat exchange plate side electrode, the electrode extension section and the terminal are formed in an integrated fashion.

\* \* \* \* \*